(12) United States Patent
Wang et al.

(10) Patent No.: US 11,496,141 B2
(45) Date of Patent: Nov. 8, 2022

(54) RADAR SYSTEM AND RELATED METHOD OF SCANNING REMOTE OBJECTS

(71) Applicant: TRON FUTURE TECH INC., Hsinchu (TW)

(72) Inventors: Yu-Jiu Wang, Hsinchu (TW); Bor-Ching Su, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 271 days.

(21) Appl. No.: 16/992,546

(22) Filed: Aug. 13, 2020

(65) Prior Publication Data

US 2021/0048520 A1 Feb. 18, 2021

Related U.S. Application Data

(60) Provisional application No. 62/886,545, filed on Aug. 14, 2019.

(51) Int. Cl.
*H03L 7/18* (2006.01)
*H03K 23/66* (2006.01)
*H03L 7/24* (2006.01)
*G01S 7/02* (2006.01)
(Continued)

(52) U.S. Cl.
CPC .............. *H03L 7/18* (2013.01); *H03K 23/662* (2013.01); *H03K 23/667* (2013.01); *H03L 7/24* (2013.01);
(Continued)

(58) Field of Classification Search
CPC ....................................................... H03L 7/18
(Continued)

(56) References Cited

U.S. PATENT DOCUMENTS 5,181,037 A * 1/1993 Komatsu ............... G01S 7/0232
342/128
8,248,298 B2 8/2012 Lalezari
(Continued)

FOREIGN PATENT DOCUMENTS

| CN | 104133216 B | 6/2016 |
| CN | 106546983 A | 3/2017 |
| EP | 3 451 016 A1 | 3/2019 |

OTHER PUBLICATIONS

Taiwanese Office Action and Search Report for Taiwanese Application No. 110112207, dated Dec. 16, 2021, with an English translation.

(Continued)

*Primary Examiner* — Lihong Yu
(74) *Attorney, Agent, or Firm* — Birch, Stewart, Kolasch & Birch, LLP

(57) ABSTRACT

A radar system includes: a processing device arranged to generate a plurality of phase shifting digital signals; a plurality of transmitting devices for generating an RF beam according to the plurality of phase shifting digital signals during a first mode; a plurality of first receiving devices for generating a plurality of first digital signals according to a plurality of first incoming signals, respectively, during a second mode; and a plurality of second receiving devices for generating a plurality of second digital signals according to a plurality of second incoming signals, respectively, during the second mode. The processing device is further arranged to distinguish a first object and a second object when the RF beam hits the first object and the second object, and the first object and the second object have a same radial speed and are located at a same range.

20 Claims, 27 Drawing Sheets

(51) Int. Cl.
  *G01S 7/295* (2006.01)
  *G01S 13/34* (2006.01)
  *H04B 7/06* (2006.01)

(52) U.S. Cl.
  CPC .............. *G01S 7/021* (2013.01); *G01S 7/295* (2013.01); *G01S 13/341* (2013.01); *H04B 7/0617* (2013.01)

(58) Field of Classification Search
  USPC ........................................................ 342/128
  See application file for complete search history.

(56) References Cited

U.S. PATENT DOCUMENTS

| | | | |
|---|---|---|---|
| 9,739,881 B1 | 8/2017 | Pavek et al. | |
| 9,869,762 B1 | 1/2018 | Alland et al. | |
| 10,048,366 B1 | 8/2018 | Hong et al. | |
| 2005/0272382 A1* | 12/2005 | Amano | H04B 7/0697 455/101 |
| 2017/0117638 A1* | 4/2017 | Kim | H01Q 21/08 |
| 2018/0120427 A1* | 5/2018 | Cornic | G01S 13/4463 |
| 2018/0156891 A1 | 6/2018 | Brune et al. | |
| 2019/0140362 A1 | 5/2019 | Edenfield et al. | |
| 2019/0293775 A1* | 9/2019 | Wasselin | G06F 30/20 |

OTHER PUBLICATIONS

Extended European Search Report for European Application No. 20191145.0, dated Dec. 17, 2020.
Taiwanese Office Action and Search Report for Taiwanese Application No. 109127625, dated Mar. 19, 2021, with English translation.

\* cited by examiner

RADAR SYSTEM AND RELATED METHOD OF SCANNING REMOTE OBJECTS

CROSS-REFERENCE TO RELATED APPLICATIONS

This application claims the benefit of priority to U.S. Provisional Application Ser. No. 62/886,545, filed on Aug. 14, 2019; the entirety of which is incorporated herein by reference for all purposes.

BACKGROUND

A radar system is developed for determining the range, angle, or velocity of objects by emitting radio waves and receiving the returned echo. The radar system may be controlled to mechanically rotate to scan for a wide-angle area. The mechanical rotating radar system may require large amounts of power in order to respond rapidly enough to deal with large numbers of targets. The mechanical errors and failures associated with mechanically scanned antennas is another disadvantages of the mechanical rotating radar system. Moreover, with the mechanical rotating systems, the radar system inevitably occupies a large installing area. Therefore, providing a novel radar system to solve the above mentioned problems is highly desirable in this field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
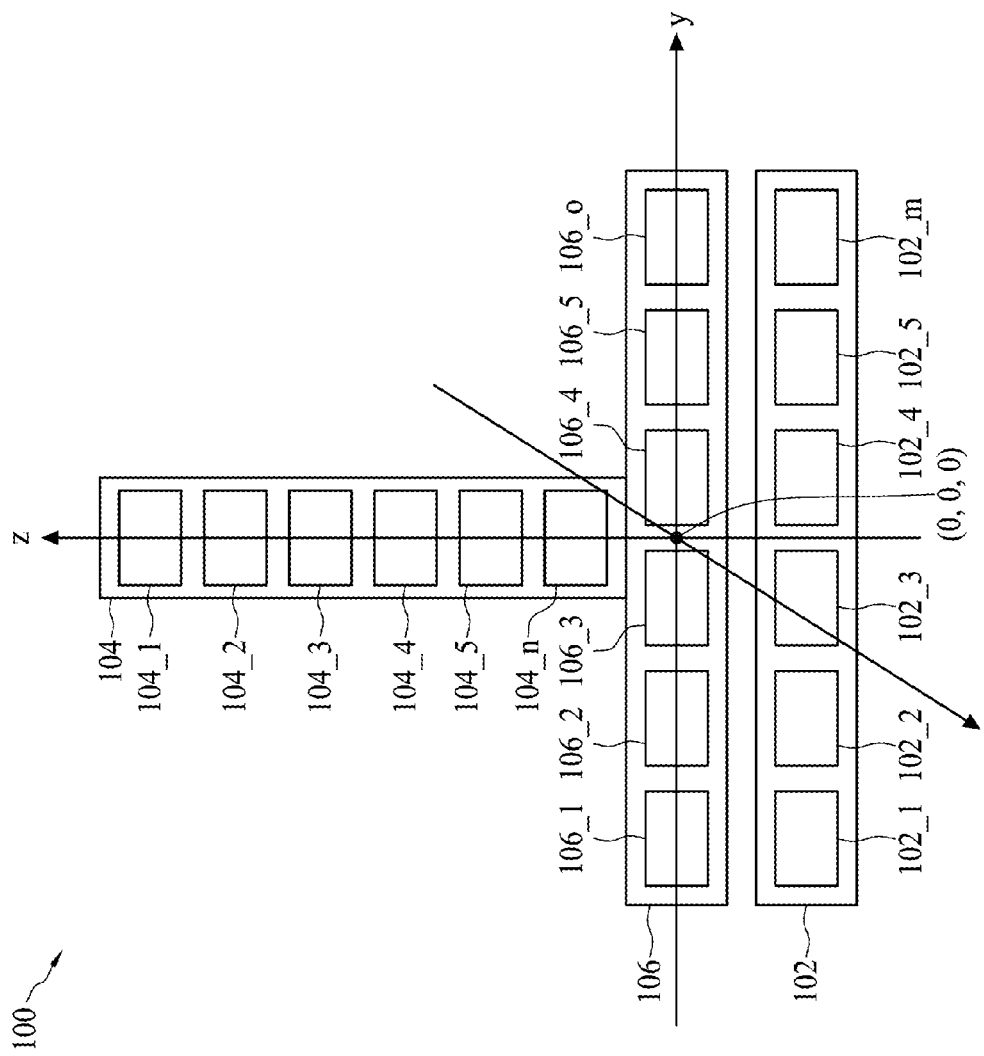
FIG. 1 is a diagram illustrating a radar system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a radar system 100 in accordance with some embodiments. The radar system 100 may be a digital active phased array radar system in which active electronically scanned array (AESA) is applied. The radar system 100 comprises at least one transmitting portion 102, at least one first receiving portion 104, at least one second receiving portion 106, and a processing device 108 (not shown in FIG. 1 but shown in FIG. 3 and FIG. 4). According to some embodiments, the transmitting portion 102 comprises a plurality of transmitting devices 102_1-102_m, in which the transmitting devices 102_1-102_m are configured to be an array of horizontal transmitters. The first receiving portion 104 comprises a plurality of receiving devices 104_1-104_n, in which the receiving devices 104_1-104_n are configured to be an array of vertical receivers. The second receiving portion 106 comprises a plurality of receiving devices 106_1-106_o, in which the receiving devices 106_1-106_o are configured to be an array of horizontal receivers. Accordingly, the array of receiving devices 104_1-104_n is orthogonal to the array of transmitting devices 102_1-102_m, and the array of receiving devices 106_1-106_o is parallel to the array of transmitting devices 102_1-102_m. Preferably, the orientation (i.e. 202 shown in FIG. 2) of the array of transmitting devices 102_1-102_m in the transmitting portion 102 is parallel to the horizon or parallel to the ground. Moreover, the symbols "m", "n", and "o" represent three integer numbers greater than one respectively. For example, the integer "m" (e.g. 6) is equal to the integer "o", and the integer "n" (e.g. 8) is greater than the integer "o". Moreover, in another embodiment, the radar system 100 may comprise a plurality of transmitting portions 102, a plurality of first receiving portions 104, and a plurality of second receiving portions 106, which is also belong to the scope of the present invention.

For the purpose of illustration, the locations of the transmitting portion 102, the first receiving portion 104, and the second receiving portion 106 may be defined by a Cartesian coordinate system. For example, in this embodiment, the transmitting portion 102, the first receiving portion 104, and the second receiving portion 106 are located at or closed to the origin (i.e. (x=0, y=0, z=0)) of the Cartesian coordinate system. More specifically, the array of receiving devices 106_1-106_o is overlapped to the y-axis, and the middle point of the array of receiving devices 106_1-106_o is located at the origin of the Cartesian coordinate system. The array of transmitting devices 102_1-102_m is disposed adjacent to the array of receiving devices 106_1-106_o. The array of receiving devices 104_1-104_n is overlapped to the z-axis, and one end of the array of receiving devices 104_1-104_n is attached on or closed to the middle point of the array of receiving devices 106_1-106_o.

Figure 2:
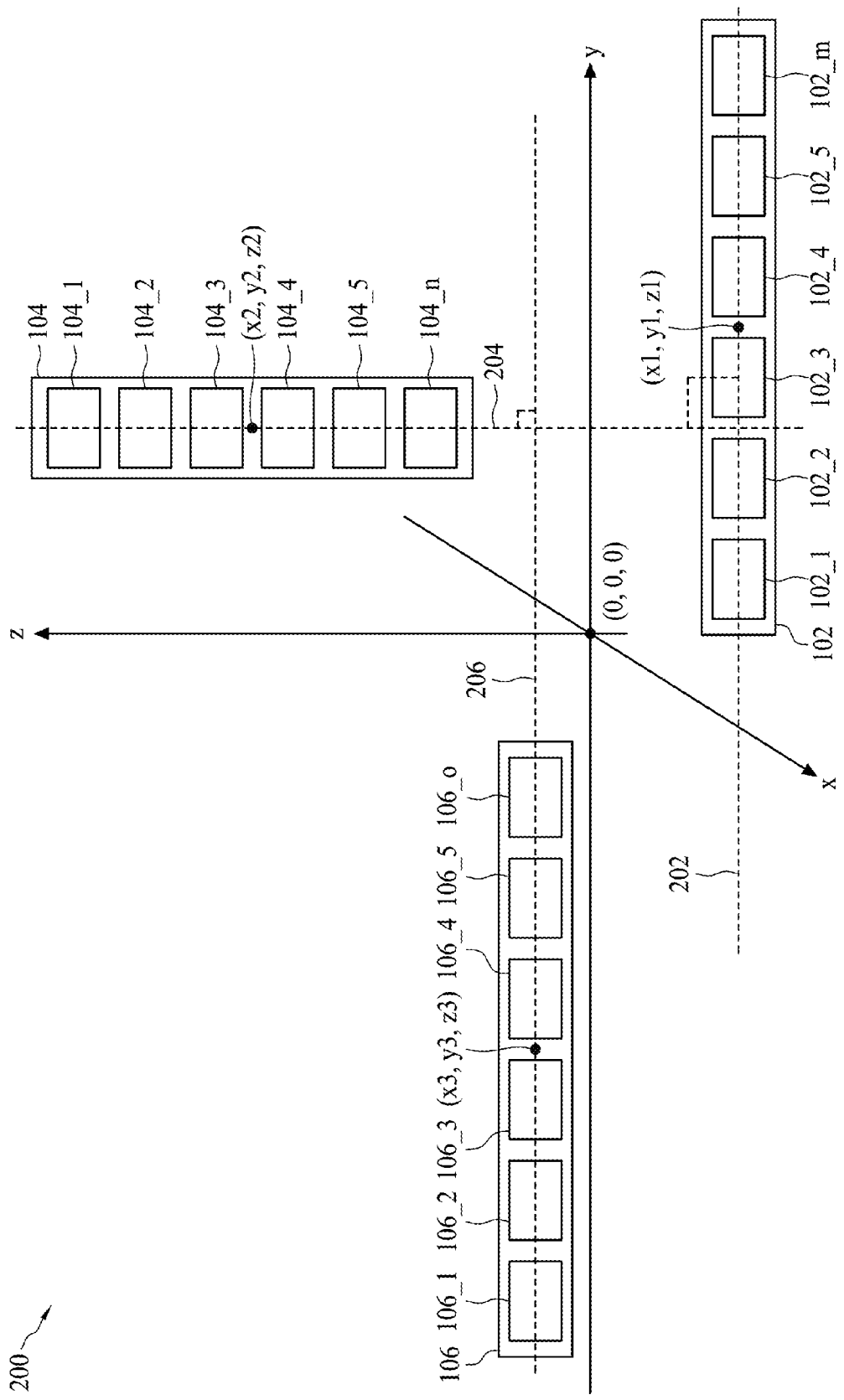
FIG. 2 is a diagram illustrating another radar system in accordance with some embodiments.

However, the allocation of the radar system 100 in FIG. 1 is not a limitation of the present invention. In some other embodiments, the array of transmitting devices 102_1-102_m, the array of receiving devices 104_1-104_n, and the array of receiving devices 106_1-106_o may be disposed at different locations on the Cartesian coordinate system as well as the orientation of the array of receiving devices 104_1-104_n is orthogonal to the orientation of the array of transmitting devices 102_1-102_m, and the orientation of the array of receiving devices 106_1-106_o is parallel to the orientation of the array of transmitting devices 102_1-102_m. For example, FIG. 2 is a diagram illustrating another radar system 200 in accordance with some embodiments. In this embodiment, the locations of the transmitting portion 102, the first receiving portion 104, and the second receiving portion 106 are deviated from the origin of the Cartesian coordinate system, in which the middle coordinate of the array of transmitting devices 102_1-102_m may be (x1, y1, z1) (e.g. (x1, y1, z1)=(3, 2, 0)), the middle coordinate of the array of receiving devices 104_1-104_n may be (x2, y2, z2) (e.g. (x2, y2, z2)=(−1, 2, 3)), and the middle coordinate of the array of receiving devices 106_1-106_o may be (x3, y3, z3) (e.g. (x3, y3, z3)=(0, −3, 1)). However, the orientation 202 of the array of receiving devices 104_1-104_n is orthogonal to the orientation 204 of the array of transmitting devices 102_1-102_m, and the orientation 206 of the array of receiving devices 106_1-106_o is parallel to the orientation 202 of the array of transmitting devices 102_1-102_m.

The arrangement of the transmitting portion 102, the first receiving portion 104, and the second receiving portion 106 shown in FIG. 2 also belongs to the scope of the present invention.

Figure 3:
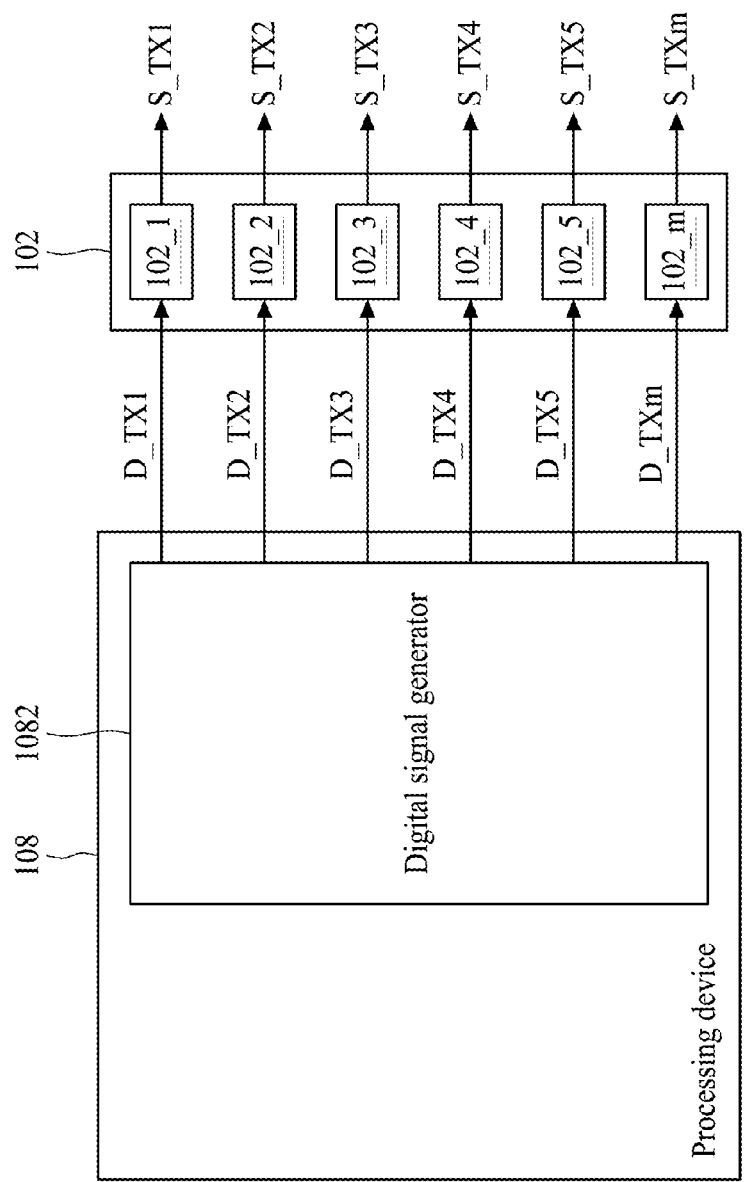
FIG. 3 is a diagram illustrating a processing device and a transmitting portion in accordance with some embodiments.

According to some embodiments, the processing device 108 may be a digital baseband processor for generating a set of digital output data D_out, in which the set of digital output data D_out includes the information of size, range, velocity, and coordinate of detected objects, and is coupled to the transmitting devices 102_1-102_m, the receiving devices 104_1-104_n, and the receiving devices 106_1-106_o. FIG. 3 is a diagram illustrating the processing device 108 and the transmitting portion 102 in accordance with some embodiments. During the transmitting mode of the radar system, a digital signal generator 1082 in the processing device 108 is arranged to generate a plurality of phase shifting digital signals D_TX1-D_TXm to the transmitting devices 102_1-102_m respectively. The transmitting devices 102_1-102_m are arranged to generate a plurality of radio frequency (RF) signals S_TX1-S_TXm according to the phase shifting digital signals D_TX1-D_TXm respectively. According to some embodiments, the RF signals S_TX1-S_TXm form an RF beam having a specific orientation, and the RF beam may comprise a main lobe and a side lobe (shown in FIG. 5 later). When the phases of the phase shifting digital signals D_TX1-D_TXm are changed, the orientation of the RF beam is also changed. Accordingly, by regularly adjusting or shifting the phases of the phase shifting digital signals D_TX1-D_TXm over time, the RF beam may scan or sweep for a specific azimuth range, e.g. from a first azimuth angle to a second azimuth angle. For example, the specific azimuth range between the first azimuth angle and the second azimuth angle may be about 60 degree. It is noted that a digital signal is a signal that is being used to represent data as a sequence of discrete values. For example, a binary signal is a digital signal with two distinguishable levels, i.e. a high voltage level and a low voltage level.

Moreover, according to some embodiments, each of the transmitting devices 102_1-102_m may comprise a digital-to-analog converter (DAC), a mixer, a power amplifier, and an antenna, in which the DAC is arranged to convert a corresponding phase shifting digital signal into a phase shifted analog signal, the mixer is arranged to up-convert or mix the phase shifted analog signal to generate an up-convert signal by using an oscillating signal, the power amplifier is arranged to generate a high power RF signal according to the up-convert signal, and the antenna is arranged to emit the corresponding RF signal according to the high power RF signal. The detailed operation of the DACs, the mixers, the power amplifiers, and the antennas are omitted here for brevity. (may be more description in this paragraph, for example, more description about the oscillating signal)

In other embodiment, each of the transmitting devices 102_1-102_m may comprise a mixer, a RF phase shifter, a power amplifier, and an antenna. For this embodiment, only one DAC is applied and coupled to the plurality of mixers of the transmitting devices 102_1-102_m. Then, each mixer is arranged to up-convert or mix the corresponding analog signal generated by the DAC to generate an up-convert signal by using an oscillating signal. The RF phase shifter is coupled between the mixer and the power amplifier for generating a phase shifted RF signal based on the up-convert signal and the phase-shifting digital signals D_TX1-D_TXm. According to the embodiment, each RF phase shifter may comprise a control port for receiving the corresponding phase-shifting digital signal. Then, the power amplifier is arranged to generate a high power RF signal according to the phase shifted RF signal, and the antenna is arranged to emit the corresponding RF signal according to the high power RF signal. This also belongs to the scope of the present invention.

Figure 4:
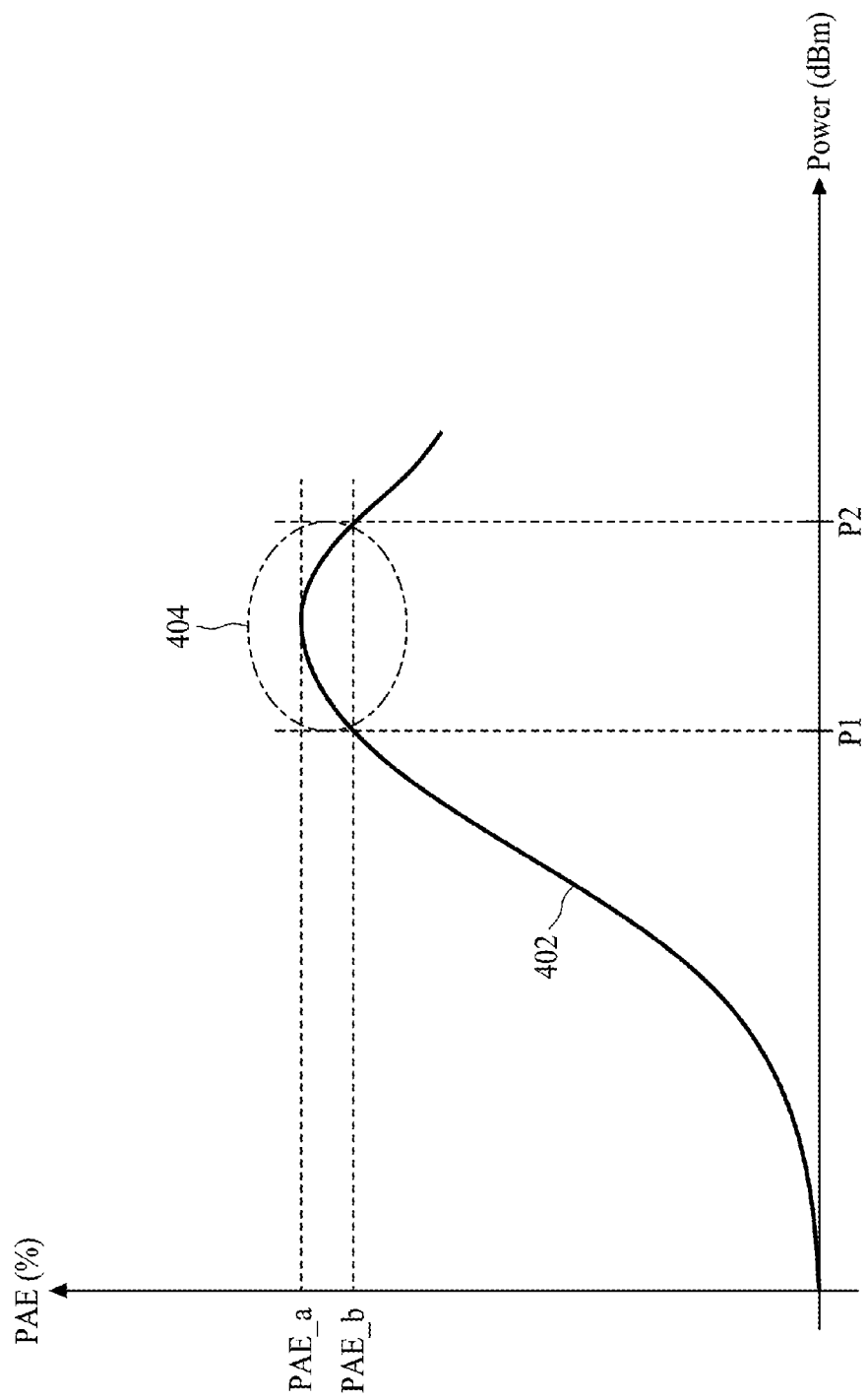
FIG. 4 is a diagram illustrating power added efficiency of a power amplifier in each transmitting device in accordance with some embodiments.

FIG. 4 is a diagram illustrating the power added efficiency (PAE) of the power amplifier in each transmitting device in accordance with some embodiments. The curve 402 illustrates the variation of the PAE versus the input power of the power amplifier in each transmitting device. According to some embodiments, during the transmitting mode, the power amplifier is arranged to operate within the relatively high PAE region 404, wherein the PAE region 404 is the region from the maximum PAE (i.e. PAE_a) to a lower PAE (i.e. PAE_b), and the lower PAE (i.e. PAE_b) is about 10%-20% lower than the maximum PAE (i.e. PAE_a). In other words, when the input power of each power amplifier may fall within the relatively high power range P1~P2 of FIG. 4, the transmitting devices 102_1-102_m may generate the RF signals S_TX1-S_TXm with relatively high power. Accordingly, by arranging all power amplifiers in the transmitting devices 102_1-102_m to generate the RF signals S_TX1-S_TXm with relatively high power, not only the detecting range of the radar system 100 is increased, the equivalent efficiency of the transmitting devices 102_1-102_m is also increased.

Figure 5:
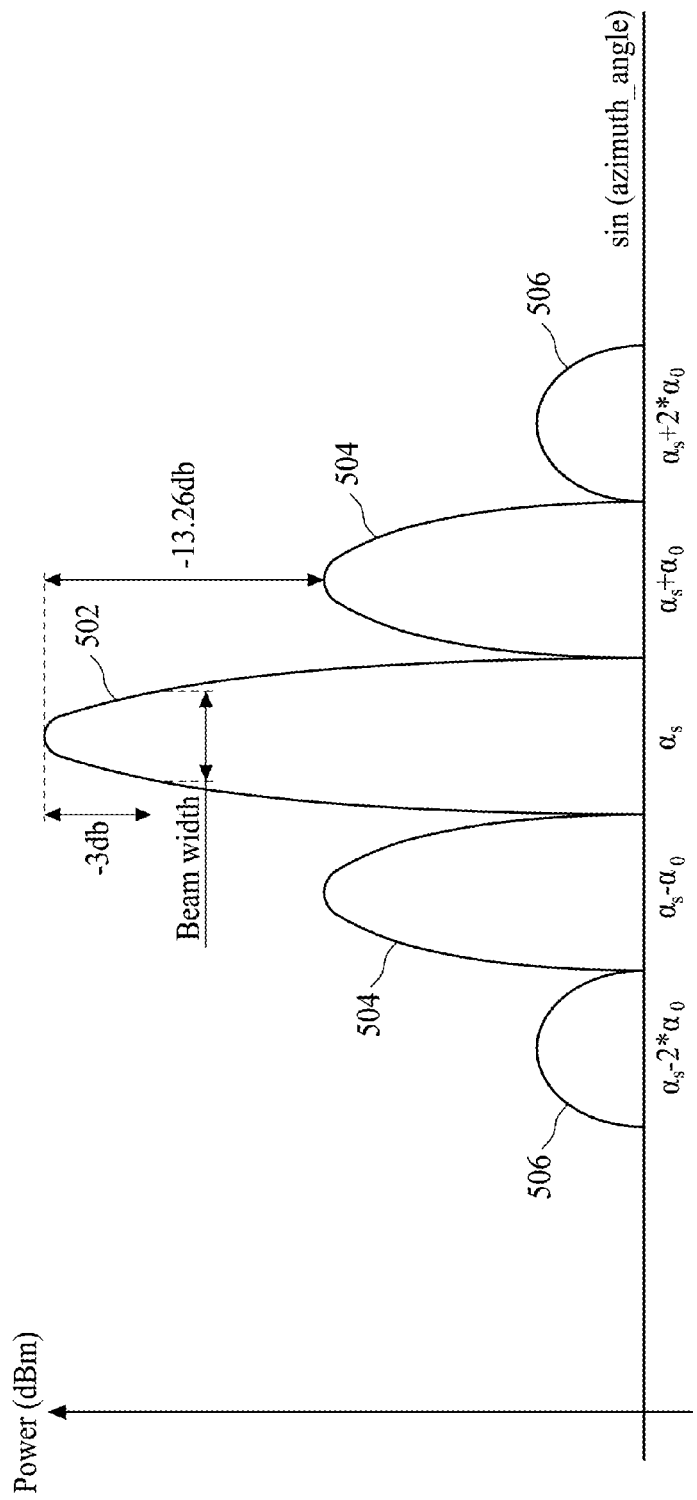
FIG. 5 is a diagram illustrating a response of a radiation pattern of RF beam in angular domain in accordance with some embodiments.
Figure 6:
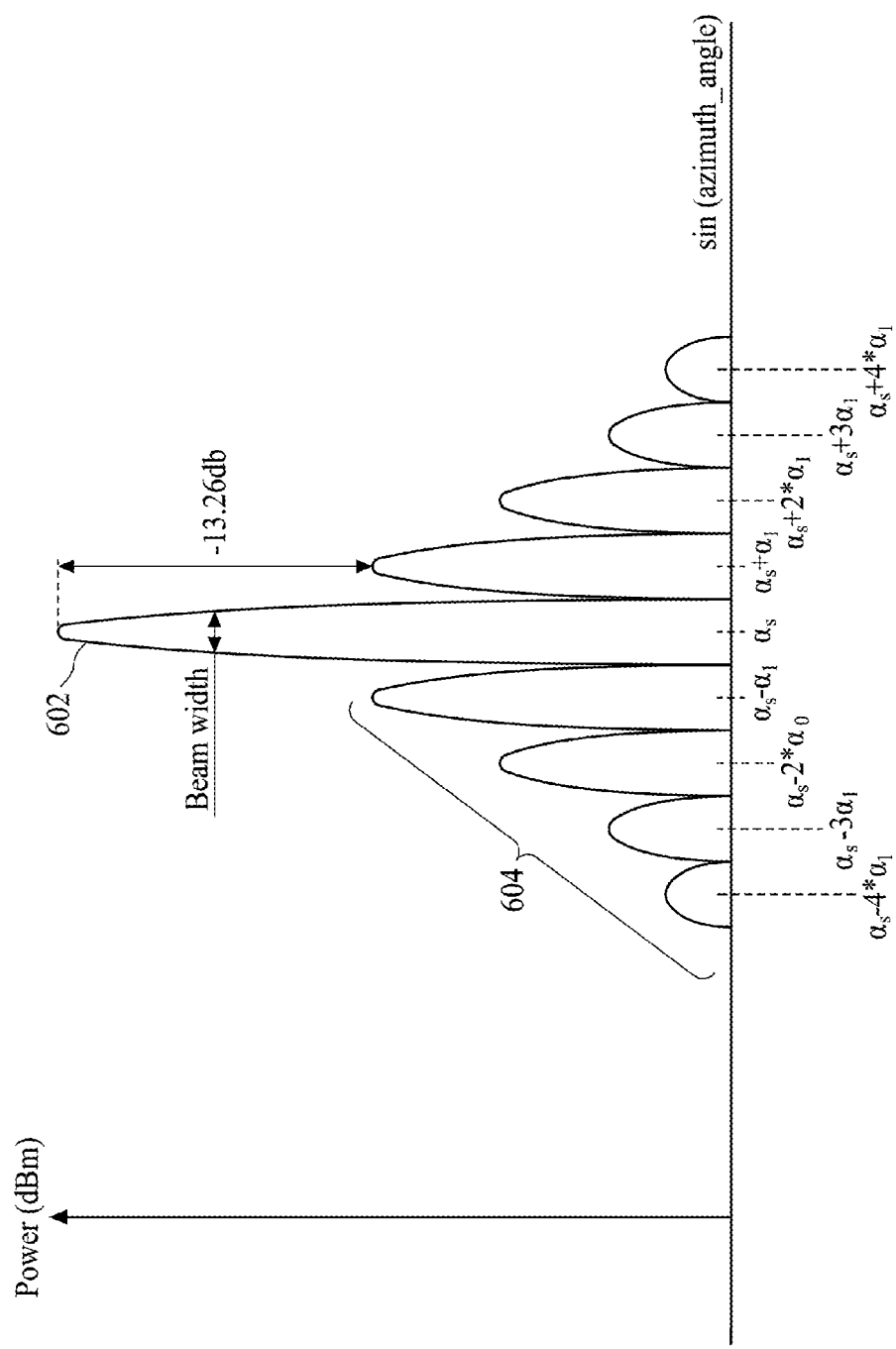
FIG. 6 is a diagram illustrating a response of another radiation pattern of RF beam in angular domain in accordance with some embodiments.

Moreover, during the transmitting mode, when the phases of the RF signals S_TX1-S_TXm are controlled to be a plurality of specific phases P_TX1-P_TXm through the adjustment of the phases of the phase shifting digital signals D_TX1-D_TXm respectively, the RF beam formed by the RF signals S_TX1-S_TXm may emit to a direction with a specific azimuth angle $\sin^{-1} \alpha_s$. More specifically, during the transmitting mode, the RF signals S_TX1-S_TXm are arranged to be uniform amplitude distribution, the RF beam may comprise a main lobe and a plurality of side lobes. FIG. 5 is a diagram illustrating a response of a radiation pattern of the RF beam in angular domain in accordance with some embodiments. The x-axis represents the azimuth angle (i.e. $\sin^{-1} \alpha$) in polar coordinate system, the y-axis represents the normalized output power in dBm. The curve 502 represents the main lobe of the RF beam, the curve 504 represents the first side lobe of the RF beam, the curve 506 represents the second side lobe of the RF beam, and so on. According to the present invention, the powers of the main lobe 502 and the powers of the side lobes 504 and 506 are predetermined. More specifically, the power of the first side lobe 504 is about or greater than −13.26 dB relative to the peak of the main beam 502. In addition, the directions of the main lobe 502 and the side lobes 504 and 506 are predetermined. In this embodiment, the direction of the main lobe 502 is in the specific azimuth angle $\sin^{-1} \alpha_s$. The directions of the first side lobes 504 are in the azimuth angle $\sin^{-1}(\alpha_s+\alpha_0)$ and $\sin^{-1}(\alpha_s-\alpha_0)$ respectively. The directions of the second side lobes 506 are in the azimuth angle $\sin^{-1}(\alpha_s+2*\alpha_0)$ and $\sin^{-1}(\alpha_s-2*\alpha_0)$ respectively. It is noted that the RF beam in FIG. 5 is not the limitation of the present embodiments. The angle difference between two adjacent side lobes, in terms of the sine of the angle, may not be fixed to $\alpha_0$. The angle difference between each two adjacent side lobes may be varied. The number of side lobes and the beam width (e.g. 3 dB width) may be depended on the number of the transmitting devices. FIG. 6 is a diagram illustrating a response of a radiation pattern of the RF beam in angular domain in accordance with some other embodiments. The RF beam in FIG. 6 comprises a main lobe 602 and a plurality of side lobes 604. In this embodiment, the RF beam in FIG. 6 has more side lobes than the RF beam in FIG. 5 and the beam width of the RF beam in FIG. 6 is smaller than the beam width of the RF beam in FIG. 5. This is because the number of transmitting devices used to generate RF beam in FIG. 6 is greater than the number of transmitting devices used to generate RF beam in FIG. 5. The resolution of azimuth angle sweep by the RF beam may be depended on the beam width of the main lobe. For example, the RF beam in FIG. 6 has greater resolution than the RF beam in FIG. 5. Similarly, the angle difference between two adjacent side lobes, in terms of the sine of the angle, may not be fixed to $\alpha_1$. The angle difference between each two adjacent side lobes is adjustable. The detailed description is omitted here for brevity.

Figure 7:
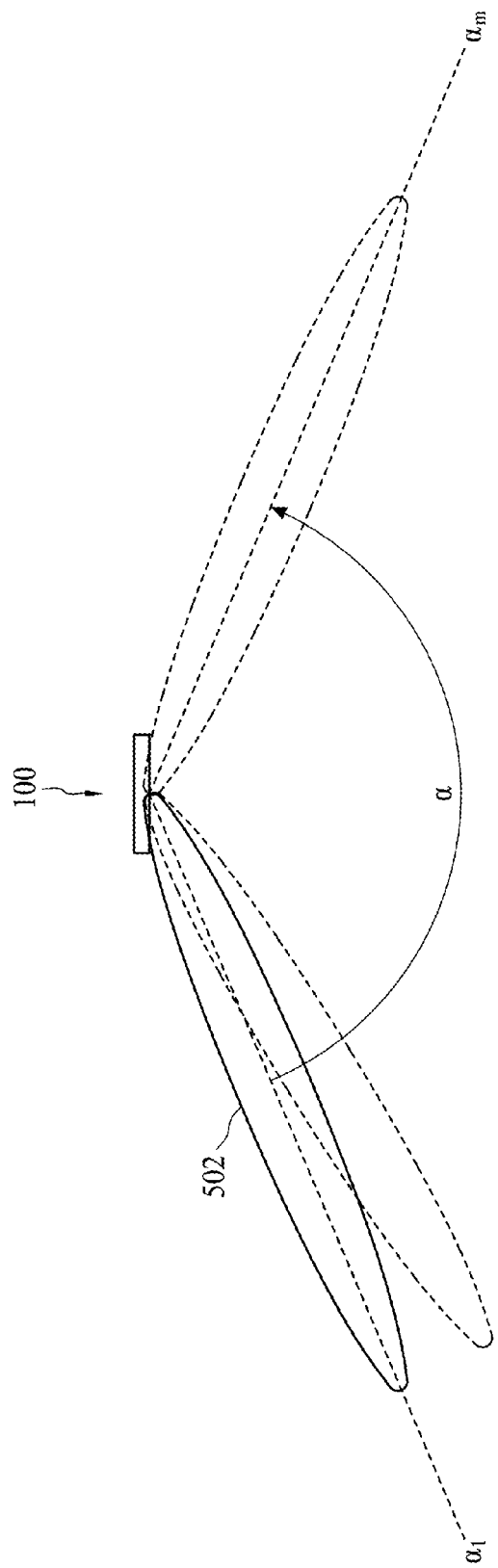
FIG. 7 is a top view diagram illustrating an RF beam generated by a radar system in accordance with some embodiments.
Figure 8:
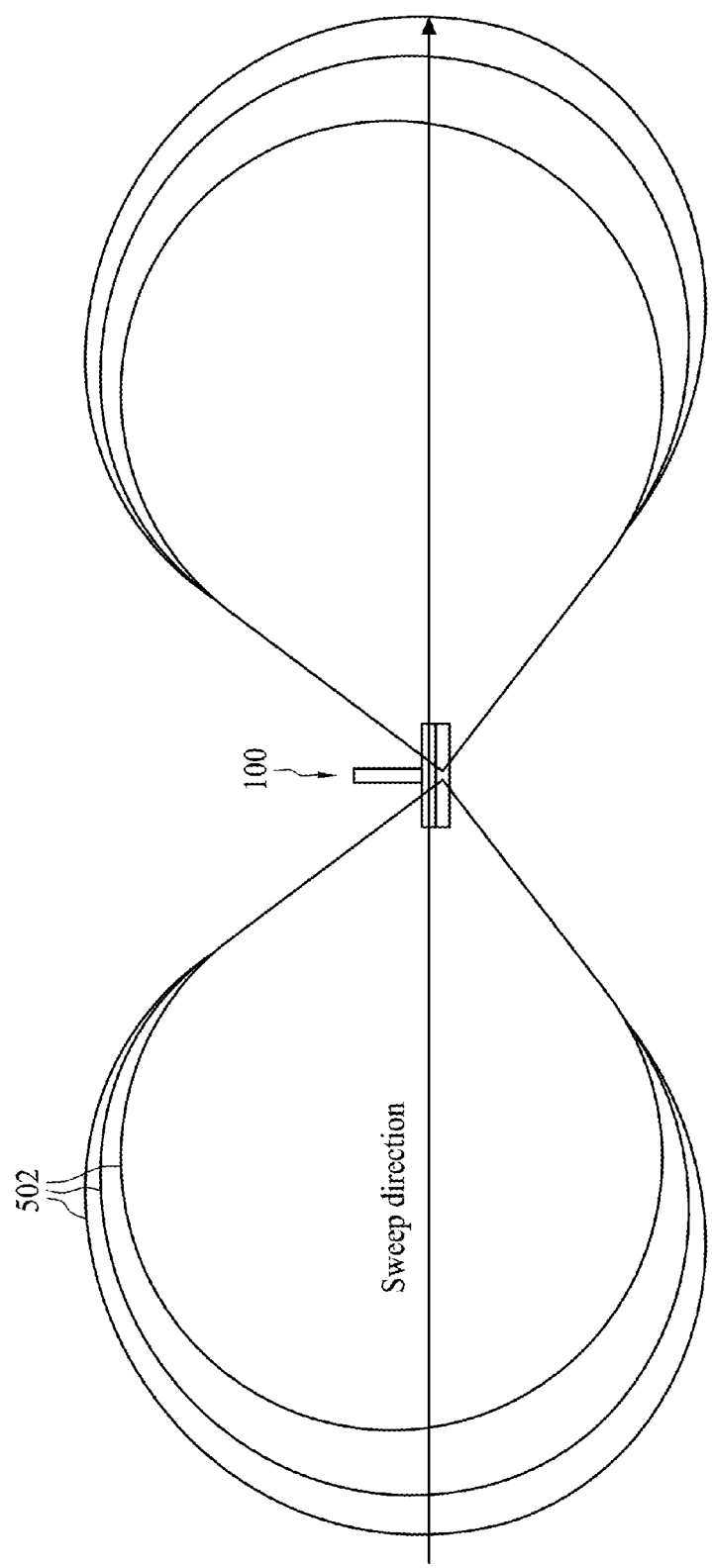
FIG. 8 is a front view diagram illustrating an RF beam generated by a radar system in accordance with some embodiments.

Back to FIG. 5, when the digital signal generator 1082 adjusts the phases of the phase shifting digital signals D_TX1-D_TXm over time, the RF beam formed by the RF signals S_TX1-S_TXm scan or sweep from a first azimuth angle to a second azimuth angle. The sweeping range (i.e. the "α" in FIG. 7) between the first azimuth angle and the second azimuth angle may be smaller than 180 degree, e.g. the sweeping range may be about 120 degree. FIG. 7 is a top view diagram illustrating the RF beam 102 generated by the radar system 100 in accordance with some embodiments. For brevity, merely the main lobe 502 of the RF beam is shown in FIG. 7. By adjusting the phases of the phase shifting digital signals D_TX1-D_TXm over time, the RF beam may sweep from the azimuth angle $\sin^{-1} \alpha_1$ to the azimuth angle $\sin^{-1} \alpha_m$. FIG. 8 is a front view diagram illustrating the RF beam 102 generated by the radar system 100 in accordance with some embodiments. For brevity, merely the main lobe 502 of the RF beam is shown in FIG. 8. According to some embodiments, the main lobe 502 may be illustrated as a fan beam or narrow beam in spatial view, in which the fan beam may be controlled to sweep from the left side (e.g. the azimuth angle $\sin^{-1} \alpha_1$) to the right side (e.g. the azimuth angle $\sin^{-1} \alpha_m$) of FIG. 8.

During the transmitting mode, the RF beam is controlled to sweep from the azimuth angle $\sin^{-1} \alpha_1$ to the azimuth angle $\sin^{-1} \alpha_m$, and the RF beam may hit one or more target or remote object when the target(s) falls within the predetermined sweeping range. According to some embodiments, the radar system 100 is capable of distinguish the object hit by the main lobe 502 and the objects hit by the side lobe 504, 506 of the RF beam. More specifically, the radar system 100 is capable of determining the 3D coordinates and the sizes of the objects when the main lobe 502 and the side lobes 504, 506 hit the objects at the same time respectively.

Figure 9:
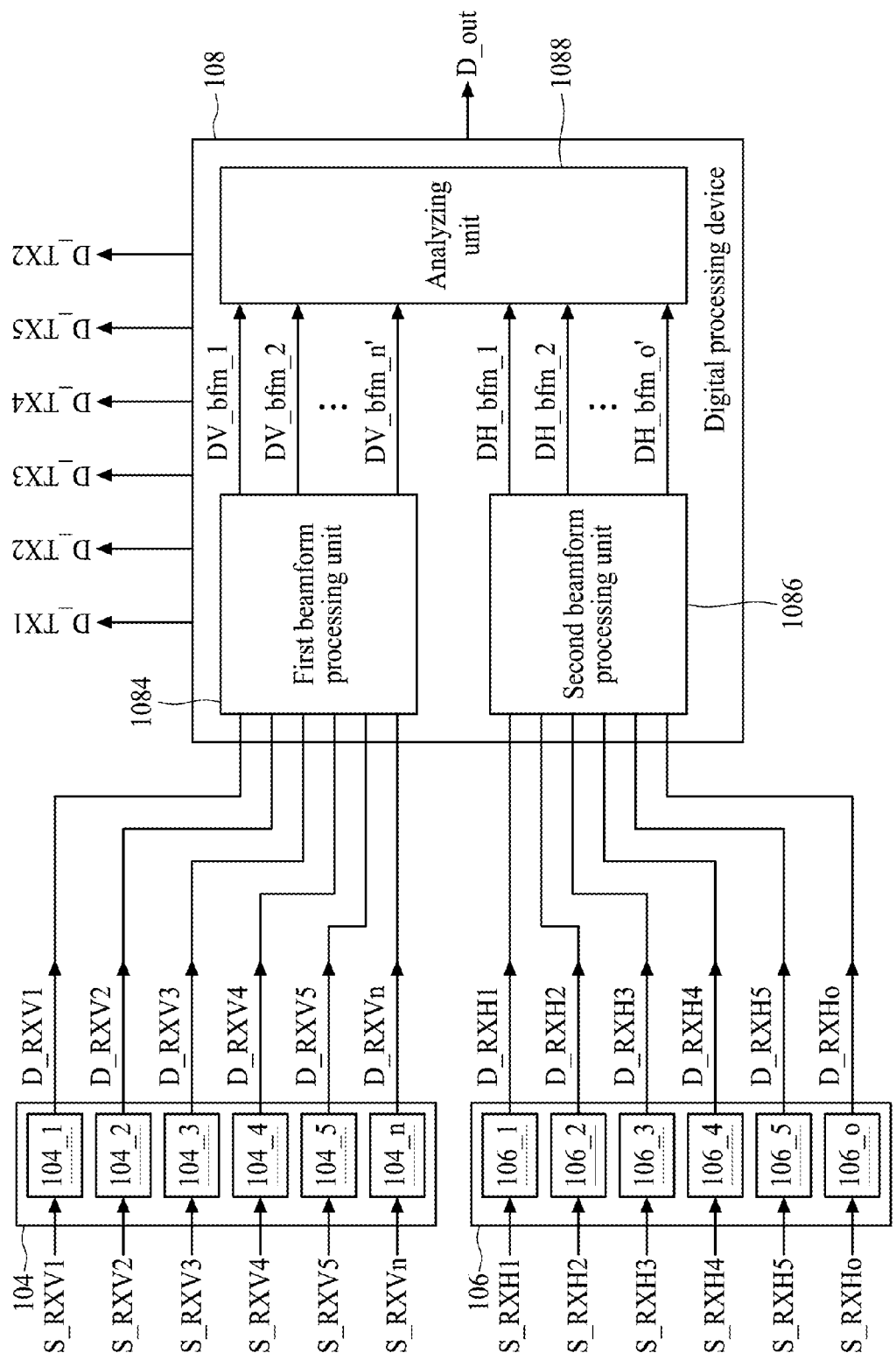
FIG. 9 is a diagram illustrating a processing device and receiving portions in accordance with some embodiments.

FIG. 9 is a diagram illustrating the processing device 108 and the receiving portions 104 and 106 in accordance with some embodiments. During the receiving mode of the radar system, the receiving devices 104_1-104_n are arranged to receive a plurality of first incoming signals S_RXV1-S_RXVn to generate a plurality of first digital signals D_RXV1-D_RXVn respectively. Meanwhile, the receiving devices 106_1-106_o are arranged to receive a plurality of second incoming signals S_RXH1-S_RXHo to generate a plurality of second digital signals D_RXH1-D_RXHo respectively. The first incoming signals S_RXV1-S_RXVn and the second incoming signals S_RXH1-S_RXHo may be the reflecting signals of the RF signals S_TX1-S_TXm (e.g. the RF beam with the main lobe 502 and the side lobes 504, 506) when the RF signals S_TX1-S_TXm hit at least one target or remote object. For example, when the RF beam formed by the RF signals S_TX1-S_TXm hit one or more object, the object(s) may reflect a signal (e.g. echo) with a corresponding radar cross-section to the direction of the radar system 100, wherein the radar cross-section (RCS) is depended on the size, the geometry, the materials, and/or structure of the object.

According to some embodiments, each of the receiving devices 104_1-104_n and 106_1-106_o may comprise an antenna, a low-noise amplifier (LNA), a mixer, and an analog-to-digital converter (ADC), in which the antenna is arranged to receive a corresponding incoming signal, the LNA is arranged to generate a low noise receiving signal, the mixer is arranged to down-convert the low noise receiving signal to generate a down-convert signal by using an oscillating signal, the ADC is arranged to convert the down-convert signal into a corresponding digital signal. The gain of a receiving device may be the equivalent signal conversion gain from the LNA to the mixer. The detailed operation of the antennas, the LNAs, the mixers, and the ADCs are omitted here for brevity.

In other embodiment, each of the receiving devices 104_1-104_n and 106_1-106_o may comprise an antenna, an LNA, and a mixer, in which the antenna is arranged to receive a corresponding incoming signal, the LNA is arranged to generate a low noise receiving signal, and the mixer is arranged to down-convert the low noise receiving signal to generate a down-convert signal by using an oscillating signal. For this embodiment, only one ADC is applied to convert the plurality of down-convert signals outputted by the mixers into the first digital signals D_RXV1-D_RXVn and the second digital signals D_RXH1-D_RXHo respectively. This also belongs to the scope of the present invention.

According to some embodiments, the processing device 108 further comprises a first beamform processing unit 1084 coupled to the receiving devices 104_1-104_n, a second beamform processing unit 1086 coupled to the receiving devices 106_1-106_o, and an analyzing unit 1088 coupled to the first beamform processing unit 1084 and the second beamform processing unit 1086. The first beamform processing unit 1084 is a multibeam processor, and the first beamform processing unit 1084 is arranged to perform a plurality of first beamforming operations upon first digital signals D_RXV1-D_RXVn to generate a plurality of first beamforming signals DV_bfm_1-DV_bfm_n' respectively, wherein the plurality of first beamforming signals DV_bfm_1-DV_bfm_n' correspond to a plurality of altitude angles respectively. More specifically, the plurality of first beamforming signals DV_bfm_1-DV_bfm_n' have the equivalent main lobes directing at the plurality of altitude angles respectively. The number of the plurality of first beamforming signals DV_bfm_1-DV_bfm_n' is n', which may be equal to or different from the number (i.e. n) of the first digital signals D_RXV1-D_RXVn. The second beamform processing unit 1086 is a multibeam processor, and the second beamform processing unit 1086 is arranged to perform a plurality of second beamforming operations upon the second digital signals D_RXH1-D_RXHo to generate a plurality of second beamforming signals DH_bfm_1-DH_bfm_o', wherein the plurality of second beamforming signals DH_bfm_1-DH_bfm_o' correspond to a plurality of azimuth angles respectively. More specifically, the plurality of second beamforming signals DH_bfm_1-DH_bfm_o' have the equivalent main lobes directing at the plurality of azimuth angles respectively. The number of the plurality of second beamforming signals DH_bfm_1-DH_bfm_o' is o', which may be equal to or different from the number (i.e. o) of the second digital signals D_RXH1-D_RXHo. The analyzing unit 1088 is arranged to calculate a first altitude angle of a first object and/or a second altitude angle of a second object according to the plurality of first beamforming signals DV_bfm_1-DV_bfm_n', and calculating a first azimuth angle of the first object and/or a second azimuth angle of the second object according to the plurality of second beamforming signals DH_bfm_1-DH_bfm_o', wherein the first object may be hit by the main lobe 502 of the RF beam and the second object may be hit by the side lobe 504 or 506 of the RF beam, and the first object and the second object may have the same radial speed with respect to the radar system 100.

Figure 10:
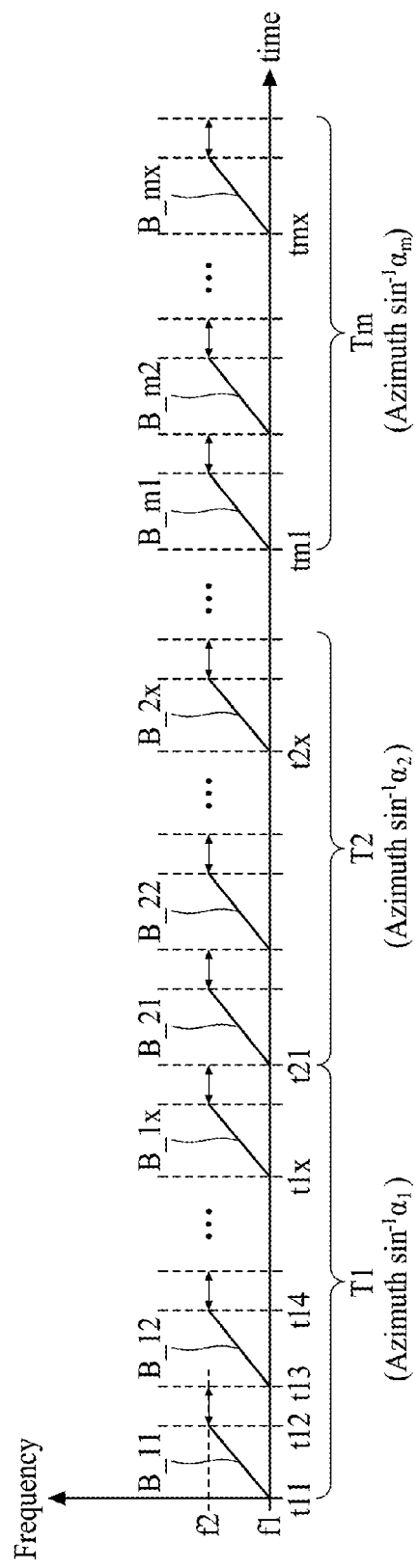
FIG. 10 is a timing diagram illustrating time slots assigned for transmitting mode and receiving mode of a radar system in accordance with some embodiments.

FIG. 10 is a timing diagram illustrating the time slots assigned for the transmitting mode and the receiving mode of the radar system 100 when the radar system 100 scans from the azimuth angle $\sin^{-1} \alpha_1$ to the azimuth angle $\sin^{-1} \alpha_m$ in accordance with some embodiments. In the time slot (e.g. T1, T2, or Tm) of each azimuth angle, the transmitting mode and the receiving mode of the radar system 100 may interchange repeatedly for transmitting a plurality of RF beams and receiving the corresponding reflecting signals. For example, when the transmitting main lobe of the RF signals S_TX1-S_TXm directs at the azimuth angle $\sin^{-1} \alpha_1$, in the time slot T1, the first RF beam B_11 formed by the RF signals S_TX1-S_TXm is outputted at time t11, and the incoming signals S_RXV1-S_RXVn and S_RXH1-S_RXHo are received at time t12; the second RF beam B_12 formed by the RF signals S_TX1-S_TXm is outputted at time t13, and the incoming signals S_RXV1-S_RXVn and S_RXH1-S_RXHo are received at time t14; and so on. Moreover, during the transmitting mode (e.g. the time interval from times t11 to t12), the frequency of the RF beams B_11-B_12 gradually increases from the frequency f1 to the frequency f2. The RF beam may be a linear frequency modulation (Linear-FM) pulse. During the receiving mode (e.g. the time intervals from times t12 to t13), the receiving devices 104_1-104_n and 106_1-106_o, which are turned off during the transmitting mode, are turned on to receive the incoming signals S_RXV1-S_RXVn and S_RXH1-S_RXHo respectively if an object(s) was hit by the RF beams. If an object is detected, the processing device 108 may determine the size (or RCS), coordinate, and the velocity of the object located in the azimuth angle $\sin^{-1} \alpha_1$.

When the detection in the azimuth angle $\sin^{-1} \alpha_1$ finish, the radar system 100 may shift the phases of the RF signals S_TX1-S_TXm such that the transmitting main lobe of the RF signals S_TX1-S_TXm directs at the next azimuth angle $\sin^{-1} \alpha_2$. In the time slot T2, the radar system 100 may repeat the similar operations in the time slot T1 for detecting the object(s) in the azimuth angle $\sin^{-1} \alpha_2$. Then, the radar system 100 may shift the phases of the RF signals S_TX1-S_TXm such that the transmitting main lobe of the RF signals S_TX1-S_TXm directs at the next azimuth angle $\sin^{-1} \alpha_3$. By repeating these operations until the azimuth angle $\sin^{-1} \alpha_m$, the radar system 100 may obtain the information of all objects in the area between the azimuth angle $\alpha_1$ and the azimuth angle $\alpha_m$.

Figure 11:
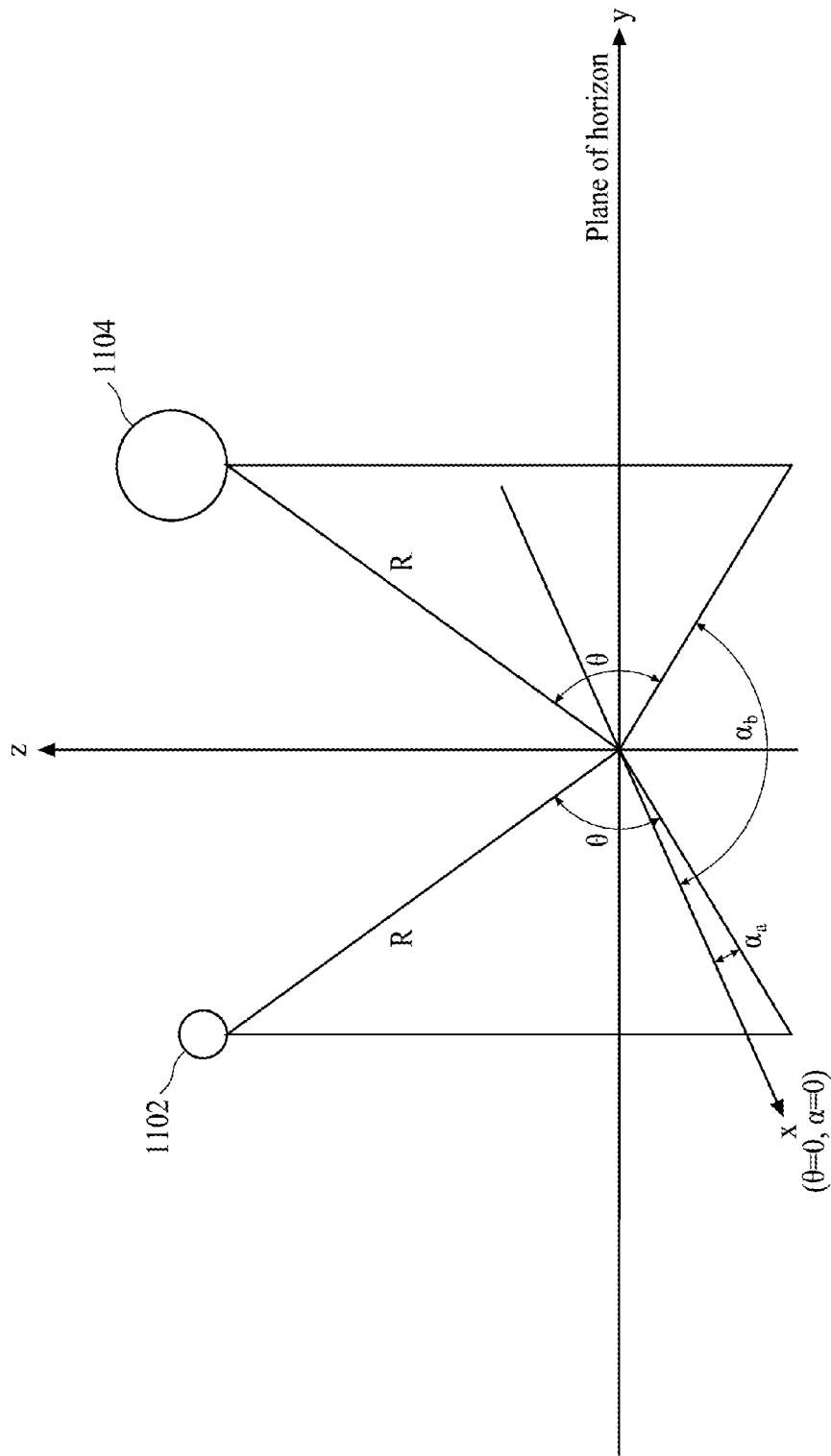
FIG. 11 shows a diagram illustrating a first object and a second object in Polar coordinate system representation in accordance with some other embodiments.

For descriptive purpose, FIG. 11 shows a diagram illustrating a first object 1102 and a second object 1104 in Polar coordinate system representation in accordance with some other embodiments. For brevity, it is assumed that the first object 1102 and the second object 1104 have the same distance R measured from the origin of the Polar coordinate system, and the first object 1102 and the second object 1104 have the same radial speed with respect to the origin of the Polar coordinate system. However, this is not a limitation of the present invention. The radar system 100 may also be able to distinguish the objects in different distances and different radials speeds respectively. In this embodiment, the size of the second object 1104 may be the same as or smaller than or greater than the size of the first object 1102. For descriptive purpose, the size of the second object 1104 is greater than the size of the first object 1102. Moreover, the azimuth angles of the first object 1102 and the second object 1104 are $\sin^{-1} \alpha_a$ and $\sin^{-1} \alpha_b$ respectively, and the first object 1102 and the second object 1104 have the same altitude angle $\sin^{-1} \theta$. The following paragraphs may illustrate how the radar system 100, which is located at the origin of the Polar coordinate system, is capable of determining the 3D coordinates and the sizes of the objects 1102 and 1104.

Figure 12:
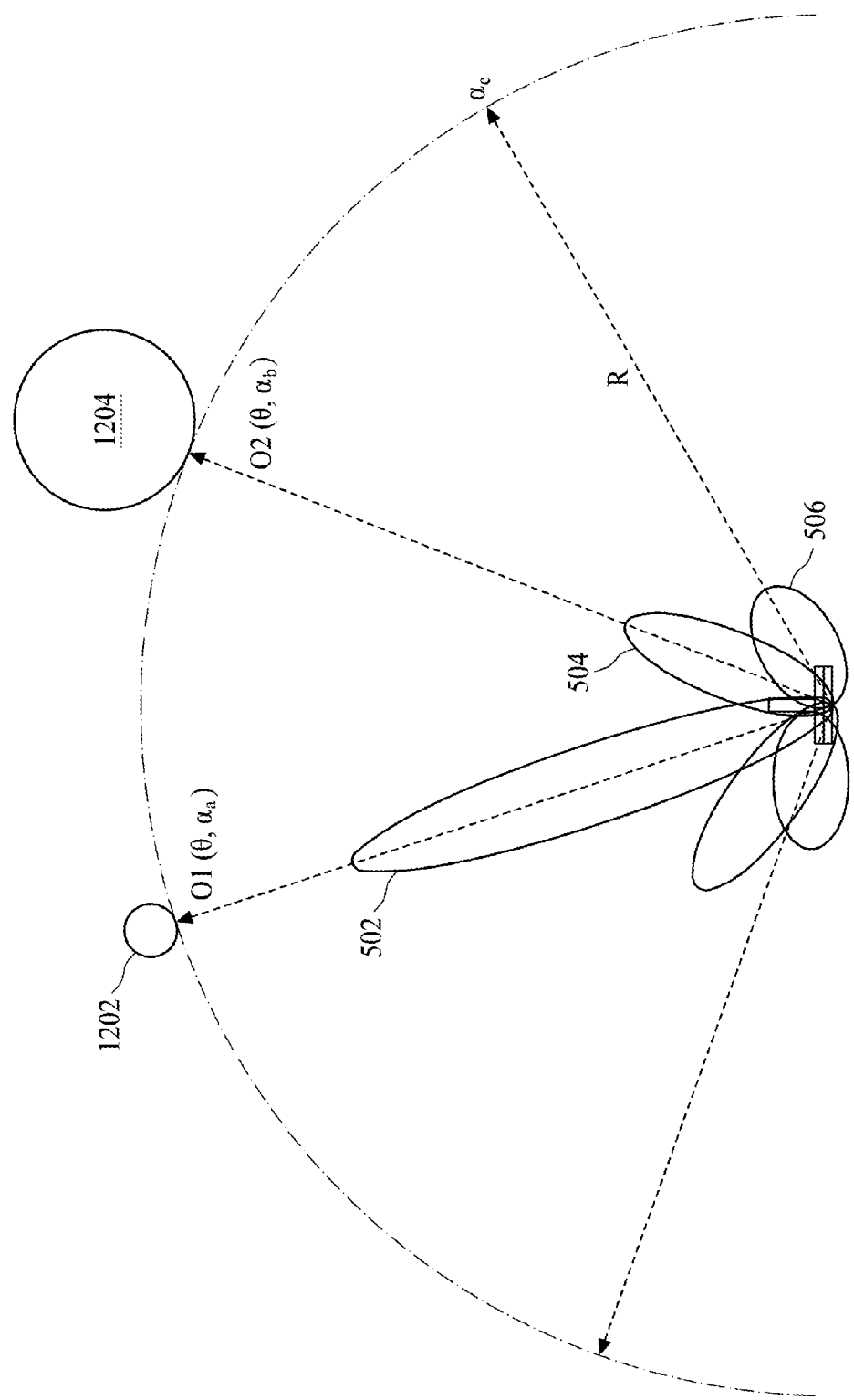
FIG. 12 is a diagram illustrating an RF beam of a radar system during the detection of a first object in accordance with some embodiments.

For the purpose of illustration, it is assumed that the angle difference between the main lobe 502 and the side lobe 504 of the RF beam is equal to the angle difference between the objects 1102 and 1104. Accordingly, when the azimuth angle of the main lobe 502 of the RF beam is changed to $\sin^{-1} \alpha_a$, the main lobe 502 and the side lobe 504 of the RF beam may hit the first object 1102 and the second object 1104 at the same time respectively as shown in FIG. 12, which is a diagram illustrating the RF beam of the radar system 100 during the detection of the first object 1102 in accordance with some embodiments. The first object 1102 and the second object 1104 have the same radial speed with respect to the radar system 100. It is noted that FIG. 12 merely shows an example of the present embodiment, and this is not a limitation of the present invention. The second object 1104 may be scanned by the side lobe 506 if the second object 1104 is in the azimuth angle of $\sin^{-1} \alpha_c$.

Figure 13:
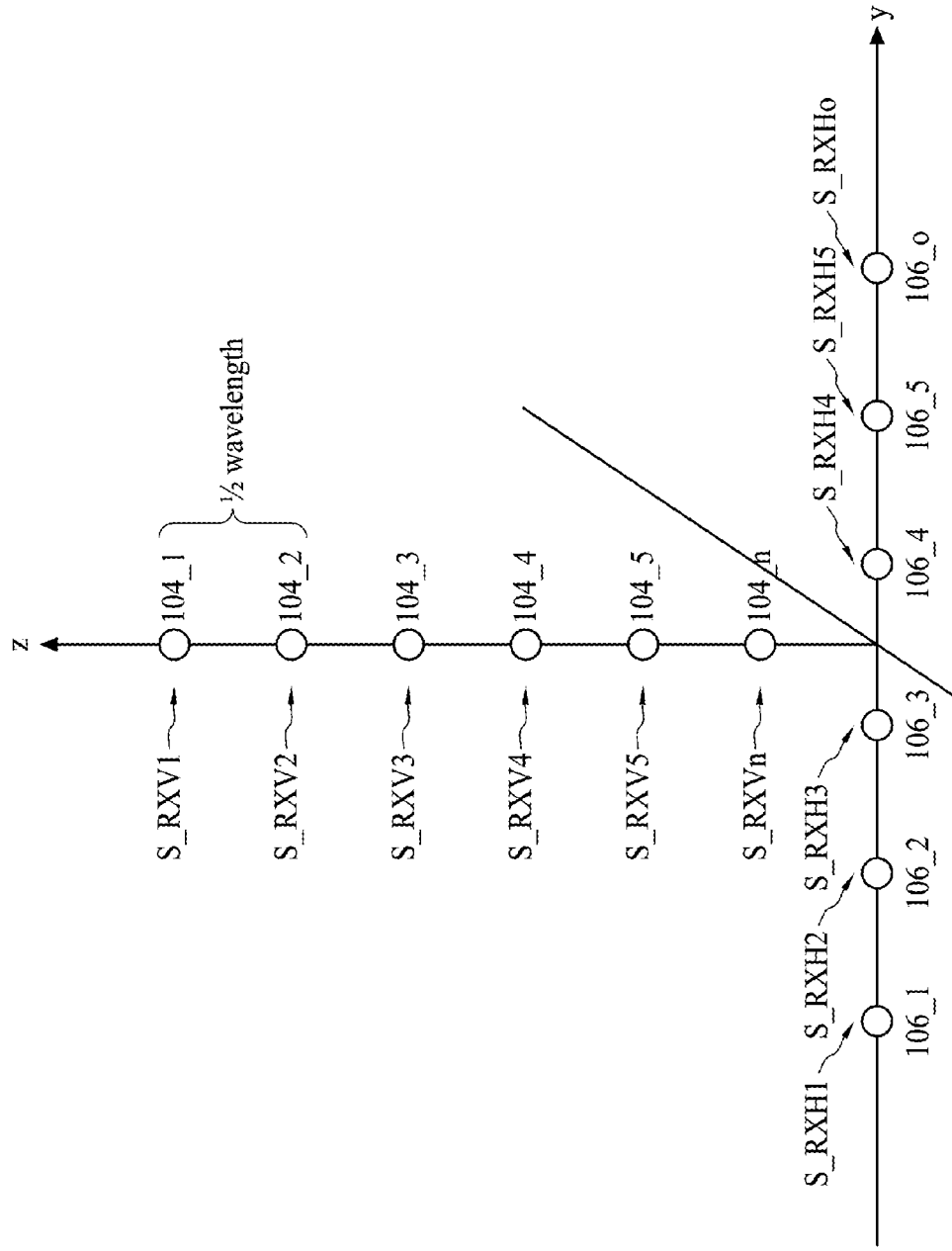
FIG. 13 is a diagram illustrating receiving devices of a radar system during the receiving mode in accordance with some embodiments.

In this embodiment, when the main lobe 502 and the side lobe 504 hit the objects 1102 and 1104 at the same time during the transmitting mode, the object 1102 may reflect a portion of the main lobe 502 to the radar system 100, and the object 1104 may also reflect a portion of the side lobe 504 to the radar system 100. Then, during the receiving mode, the receiving devices 104_1-104_n and 106_1-106_o of the radar system 100 are turned on to receive the reflecting signals of the objects 1102 and 1104 as shown in the FIG. 13, which is a diagram illustrating the receiving devices 104_1-104_n and 106_1-106_o of the radar system 100 during the receiving mode in accordance with some embodiments. During the receiving mode, the transmitting devices 102_1-102_m are turned off. As the objects 1102 and 1104 have the same distance (i.e. R) measured from the radar system 100, the reflecting signals of the objects 1102 and 1104 may reach the radar system 100 at the same time. Accordingly, the incoming signals S_RXV1-S_RXVn and S_RXH1-S_RXHo may include the reflecting signals of the objects 1102 and 1104. In this embodiment, it is assumed that the range R is much greater than the size of the radar system 100. For example, the range R is at least 100 times greater than the length or width of the radar system 100.

Figure 14:
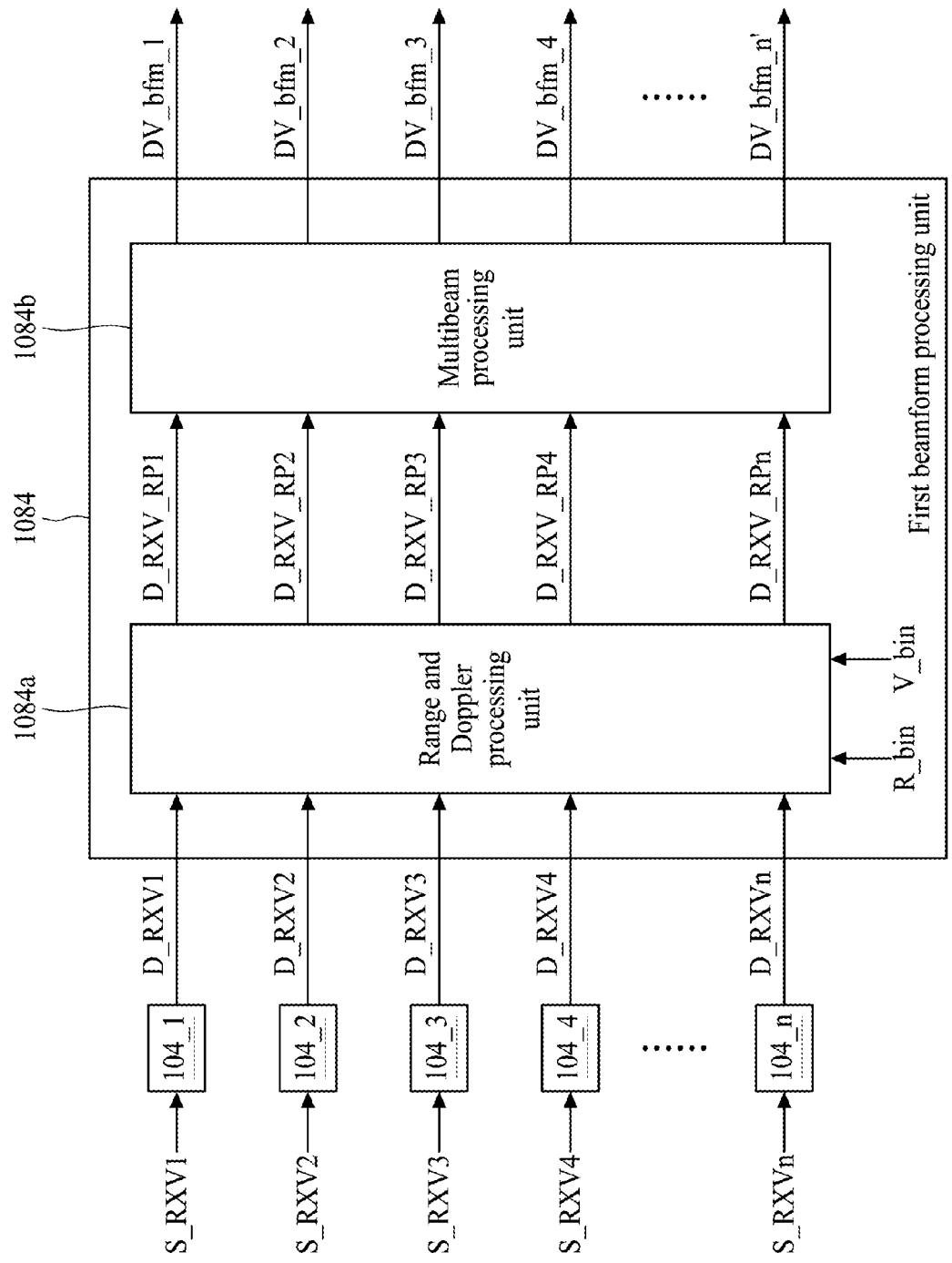
FIG. 14 is a diagram illustrating a plurality of receiving devices during the receiving mode in accordance with some embodiments.

FIG. 14 is a diagram illustrating the receiving devices 104_1-104_n and the first beamform processing unit 1084 in accordance with some embodiments. According to the present invention, the digital signals D_RXV1-D_RXVn generated by the receiving devices 104_1-104_n are based on the incoming signals S_RXV1-S_RXVn respectively. In other words, the receiving devices 104_1-104_n are arranged to one-to-one generate the digital signals D_RXV1-D_RXVn according to the incoming signals S_RXV1-S_RXVn respectively. Therefore, the receiving devices 104_1-104_n may be regarded as an all-digital receiver. During the receiving mode, the digital signals D_RXV1-D_RXVn are processed by a range and doppler processing unit 1084a in the first beamform processing unit 1084 to generate a plurality of processed digital signals D_RXV_RP1-

D_RXV_RPn respectively. According to the present embodiment, the range and doppler processing unit 1084*a* generates the plurality of processed digital signals D_RXV_RP1-D_RXV_RPn according to a range index R_bin and a velocity index V_bin. For example, the range and doppler processing unit 1084*a* may be configured as a matched filter followed by a fast Fourier transform to generate the plurality of processed digital signals D_RXV_RP1-D_RXV_RPn according to the range index R_bin and the velocity index V_bin.

More specifically, as mentioned in the paragraphs related to FIG. 10 and FIG. 12, after the radar system 100 scans for the azimuth angle $\sin^{-1} \alpha_a$ in the corresponding time slot (e.g. Ta), the radar system 100 may receive the information of all detected objects corresponding to the azimuth angle $\sin^{-1} \alpha_a$. According to the present embodiment, the objects corresponding to a specific range and a specific velocity may be filtered out by the range and doppler processing unit 1084*a* by using the corresponding range index R_bin and velocity index V_bin. Therefore, in this embodiment, when the appropriate range index R_bin and velocity index V_bin are inputted to the range and doppler processing unit 1084*a*, the range and doppler processing unit 1084*a* receives may generate the plurality of processed digital signals D_RXV_RP1-D_RXV_RPn corresponding to the objects (e.g. the first object 1102 and the second object 1104) located in the same range (i.e. R) and have the same radial speed (or velocity).

Figure 15:
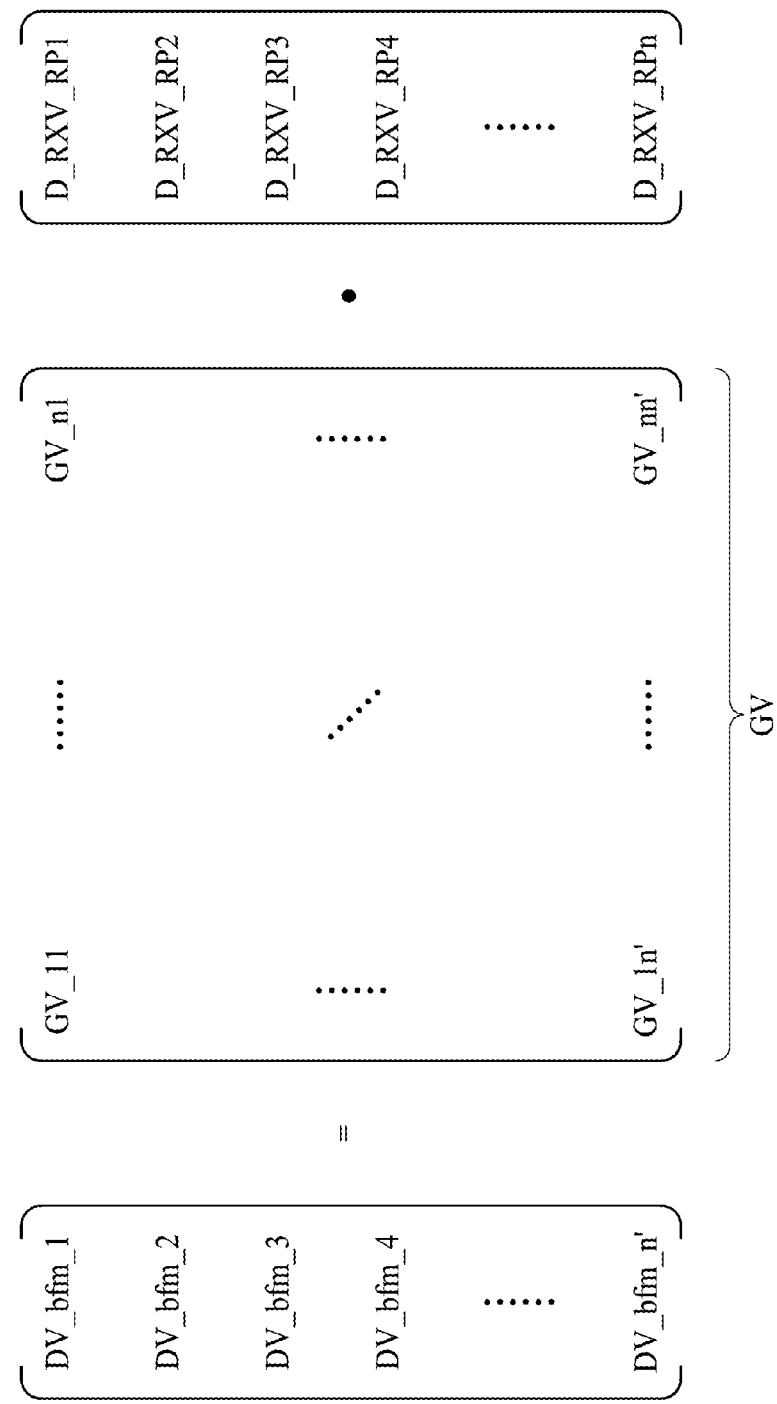
FIG. 15 is a diagram illustrating the generation of a plurality of first beamforming signals from a plurality of processed digital signals by using a gain matrix in accordance with some embodiments.

Then, the multibeam processing unit 1084*b* in the first beamform processing unit 1084 is arranged to perform a beamforming operation (or multibeam processing) upon the plurality of processed digital signals D_RXV_RP1-D_RXV_RPn to generate the plurality of first beamforming signals DV_bfm_1-DV_bfm_n' according to a gain matrix GV. The plurality of first beamforming signals DV_bfm_1-DV_bfm_n' correspond to a plurality of altitude angles $\sin^{-1} \theta 1$-$\sin^{-1} \theta n'$ respectively. FIG. 15 is a diagram illustrating the generation of the plurality of first beamforming signals DV_bfm_1-DV_bfm_n' from the plurality of processed digital signals D_RXV_RP1-D_RXV_RPn by using the gain matrix GV in accordance with some embodiments. FIG. 15 is a simplified illustration of the generation of the plurality of first beamforming signals DV_bfm_1-DV_bfm_n'. The generation of the plurality of first beamforming signals DV_bfm_1-DV_bfm_n' may be regarded as a dot product of the gain vector GV and the values of the plurality of processed digital signals D_RXV_RP1-D_RXV_RPn. The gain matrix GV is a rectangular array comprising a plurality of complex gains, i.e. {(GV_11, GV_21, . . . , GV_n1), (GV_12, GV_22, . . . , GV_n2), . . . , (GV_1n', GV_2n', . . . , GV_nn')}. Therefore, the gain matrix GV is a complex-valued gain matrix. The complex gains in the gain matrix GV may be independently adjusted to provide weightings for the plurality of processed digital signals D_RXV_RP1-D_RXV_RPn. For example, the first set of complex gains (GV_11, GV_21, . . . , GV_n1) is used to weight the plurality of processed digital signals D_RXV_RP1-D_RXV_RPn respectively, such that the first beamforming signal DV_bfm_1 has a receiving main lobe directing at the first altitude angle $\sin^{-1} \theta 1$. The second set of complex gains (GV_12, GV_22, . . . , GV_n2) is used to weight the plurality of processed digital signals D_RXV_RP1-D_RXV_RPn respectively, such that the first beamforming signal DV_bfm_2 has a receiving main lobe directing at the second altitude angle $\sin^{-1} \theta 2$, and so on. According to the present invention, the gain matrix GV is determined by the first beamform processing unit 1084. However, this is not a limitation of the present invention. The gain matrix GV may be determined by a processing unit external to the first beamform processing unit 1084.

Figure 16:
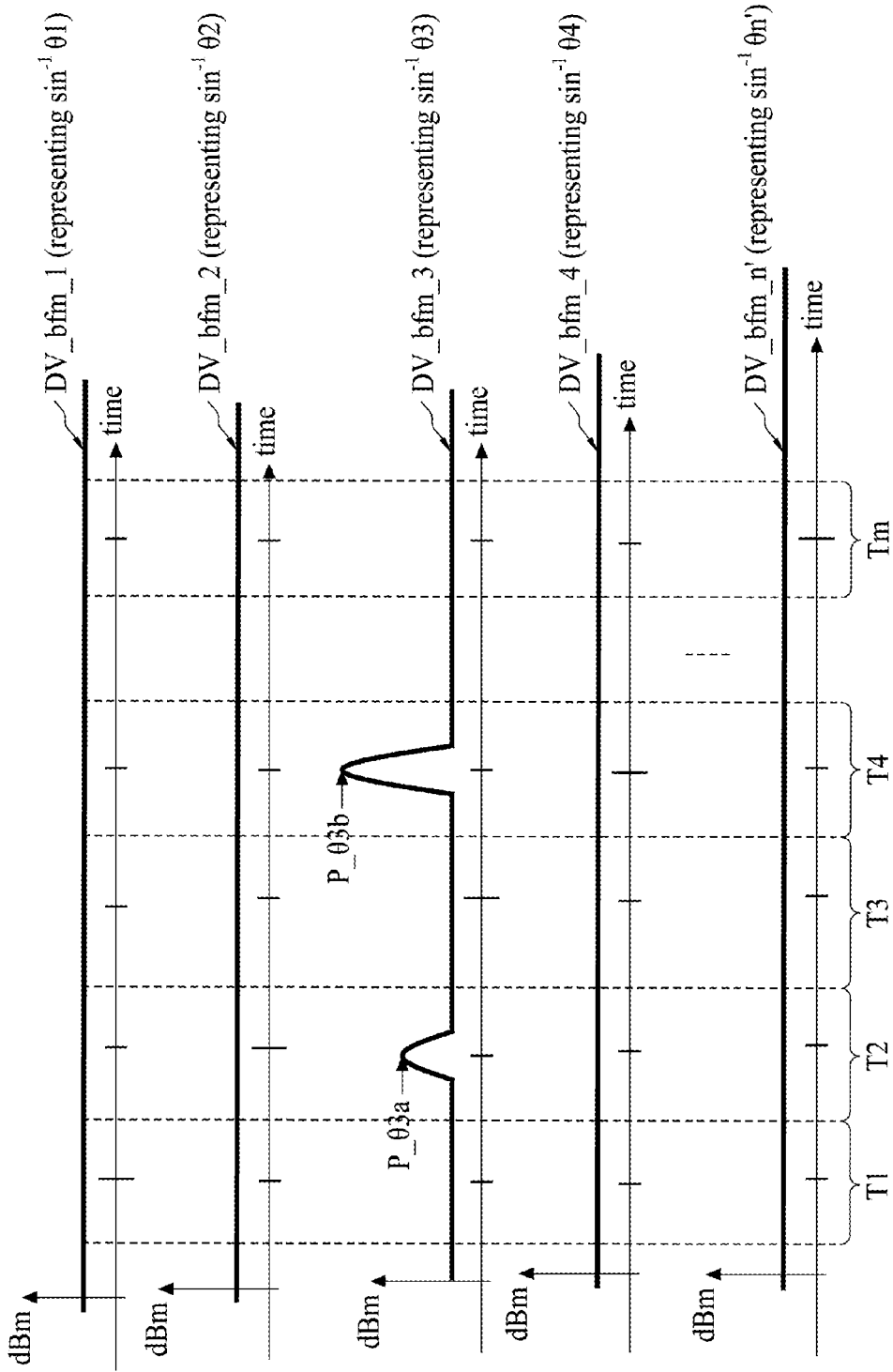
FIG. 16 is a diagram illustrating the powers of a plurality of first beamforming signals in accordance with some embodiments.

FIG. 16 is a diagram illustrating the powers of the plurality of first beamforming signals DV_bfm_1-DV_bfm_n' when the radar system 100 scans from the azimuth angle $\sin^{-1} \alpha_1$ to the azimuth angle $\sin^{-1} \alpha_m$ in accordance with some embodiments. The time domain of FIG. 16 is similar to the time domain of FIG. 10. More specifically, in the time slot T1, the transmitting main lobe of the RF signals S_TX1-S_TXm directs at the azimuth angle $\sin^{-1} \alpha_1$; in the time slot T2, the transmitting main lobe of the RF signals S_TX1-S_TXm directs at the azimuth angle $\sin^{-1} \alpha_2$; and so on. Under the scenario as shown in FIG. 11, in the time slots T2 and T4 (i.e. when $\sin^{-1} \alpha_2 = \sin^{-1} \alpha_a$, and $\sin^{-1} \alpha_4 = \sin^{-1} \alpha_b$), the beamforming signal DV_bfm_3 may have power P_θ3a and P_θ3b respectively. Except for the beamforming signal DV_bfm_3, the powers of other beamforming signals DV_bfm_1-DV_bfm_2 and DV_bfm_4-DV_bfm_n' are closed to zero (or no power). When the power of the beamforming signal DV_bfm_3 is not zero, the analyzing unit 1088 may determine an object(s) is detected in the altitude angle $\sin^{-1} \theta 3$ (i.e. the altitude angle $\sin^{-1}$ & of the objects 1102 and 1104). Moreover, the power P_θ3a of the beamforming signal DV_bfm_3 is at least depended on or proportional to the power of main lobe 502 and the RCS of the object 1102, and the power P_θ3b of the beamforming signal DV_bfm_3 is at least depended on or proportional to the power of main lobe 502 and the RCS of the object 1104. In this embodiment, as the size of the object 1104 is greater than the size of the object 1104, the power P_θ3b is greater than the power P_θ3b.

Figure 17:
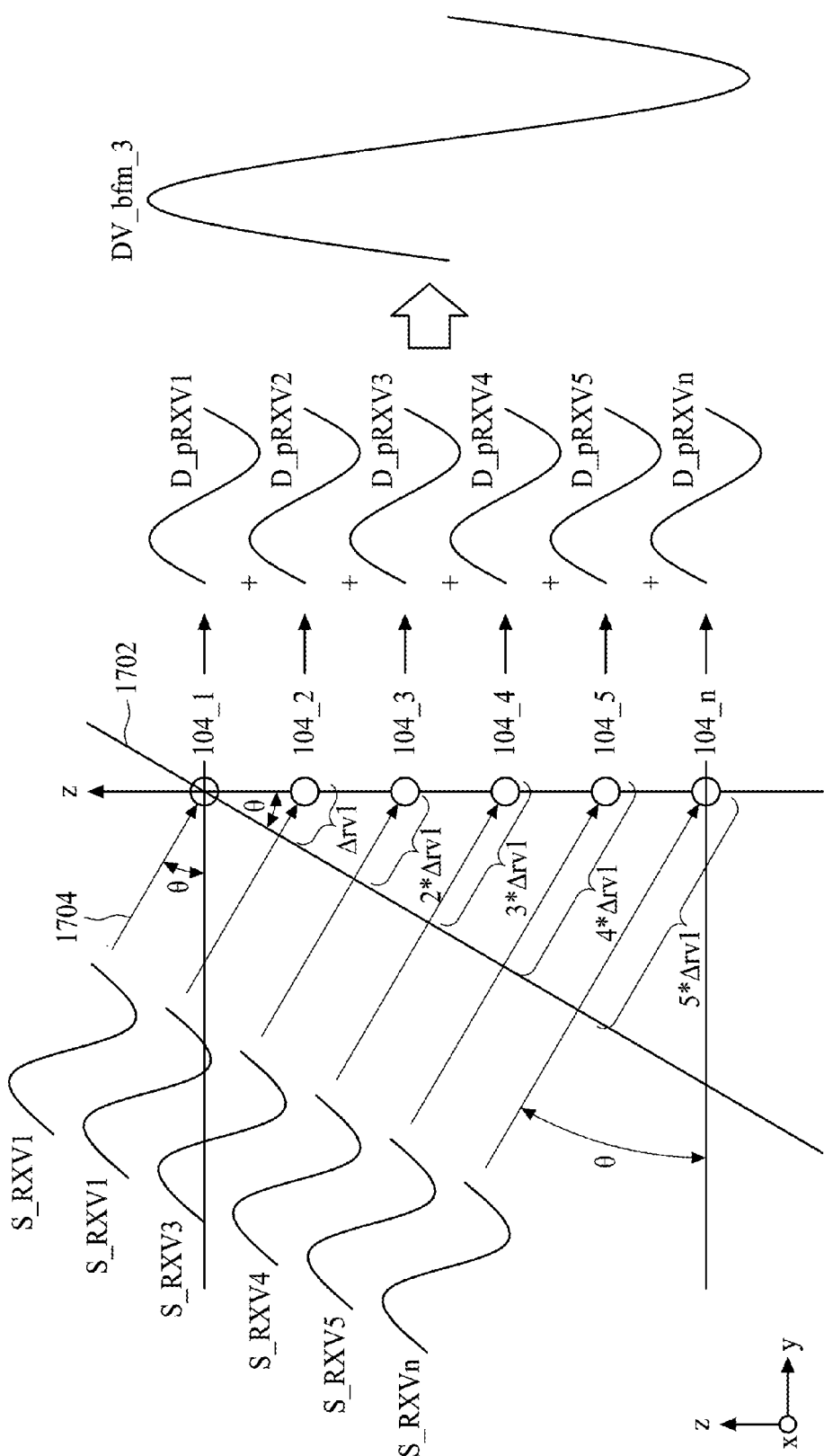
FIG. 17 is a diagram illustrating the beamforming operation of a beamforming signal in accordance with some embodiments.

FIG. 17 is a simplified diagram illustrating the beamforming operation of a beamforming signal in accordance with some embodiments. For illustration purpose, the range and doppler processing unit 1084*a* is omitted here for brevity. For the example of the beamforming signal DV_bfm_3, when the incoming signals S_RXV1-S_RXVn reach the receiving devices 104_1-104_n respectively, the incoming signals S_RXV1-S_RXVn may be regarded as parallel signals. Therefore, the incoming signals S_RXV1-S_RXVn may have the same incident angle (i.e. the altitude angle $\sin^{-1} \theta$) with respect to the horizontal plane (i.e. the plane constituted by x-axis and y-axis). The receiving devices 104_1-104_n may receive the incoming signals S_RXV1-S_RXVn at different times (or different phases) respectively. Then, when the first beamform processing unit 1084 receives the digital signals D_RXV1-D_RXVn, the first beamform processing unit 1084 may shift the digital signals D_RXV1-D_RXVn by a plurality of shifting times (e.g. through the set of complex gains (GV_13, GV_23, . . . , GV_n3)) to generate a plurality of shifted digital signals D_pRXV1-D_pRXVn respectively. Then, the first beamform processing unit 1084 may add up the shifted digital signals D_pRXV1-D_pRXVn, and to calculate the power of the beamforming signal DV_bfm_3 of the shifted digital signals D_pRXV1-D_pRXVn. When the beamforming signal DV_bfm_3 of the shifted digital signals D_pRXV1-D_pRXVn has the relatively large power (e.g. P_θ3a and P_θ3b) in comparison to the beamforming signals with other shifting times, it means that the shifted digital signals D_pRXV1-D_pRXVn substantially have the same phase. Then, the first beamform processing unit 1084 or the analyzing unit 1088 may determine an object(s) (e.g. the objects 1102 and 1104) is located in the altitude angle $\sin^{-1} \theta$.

More specifically, in FIG. 17, the first beamform processing unit 1084 may set the receiving time of the digital signal D_RXV1 as the reference time. Then, the first beamform processing unit 1084 may delay the receiving times of the digital signals D_RXV2-D_RXVn to generate the shifted digital signals D_pRXV2-D_pRXVn respectively. The delay times of the digital signals D_RXV2-D_RXVn may be $\Delta rv1$, $2*\Delta rv1$, $3*\Delta rv1$, $4*\Delta rv1$, and $5*\Delta rv1$ as shown in FIG. 17, in which the delay times $\Delta rv1$, $2*\Delta rv1$, $3*\Delta rv1$, $4*\Delta rv1$, and $5*rv1$ correspond to the altitude angle $\sin^{-1} \theta$, and the delay times $\Delta rv1$, $2*\Delta rv1$, $3*\Delta rv1$, $4*\Delta rv1$, and $5*rv1$ are the transmitting times of the incoming signals S_RXV1-S_RXVn from the reference plane 1702 to the receiving devices 104_2-104_n respectively. The reference plane 1702 is a plane or a line perpendicular to the transmission directions (e.g. 1704) of the incoming signals S_RXV1-S_RXVn. When the shifted digital signals D_pRXV1-D_pRXVn are in-phase, the first beamform processing unit 1084 or the analyzing unit 1088 may determine that the objects 1102 and 1104 are located in the altitude angle $\sin^{-1} \theta$.

Figure 18:
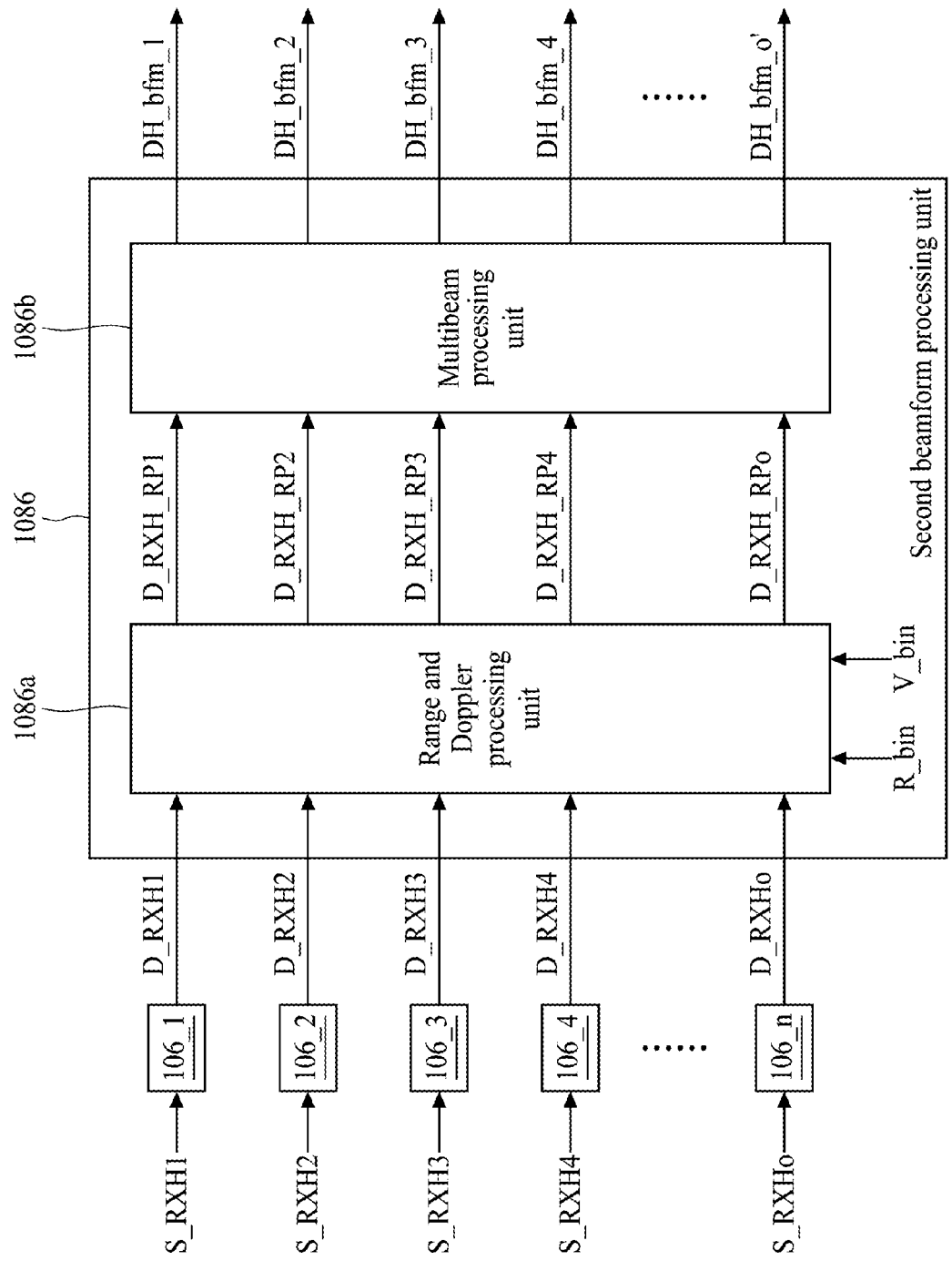
FIG. 18 is a diagram illustrating a plurality of receiving devices during the receiving mode in accordance with some embodiments.

During the receiving mode, the receiving devices 106_1-106_o are also arranged to receive the incoming signals S_RXH1-S_RXHo and to respectively generate the digital signals D_RXH1-D_RXHo to the second beamform processing unit 1086 as shown in FIG. 18, which is a diagram illustrating the receiving devices 106_1-106_o and the second beamform processing unit 1086 in accordance with some embodiments. The digital signals D_RXH1-D_RXHo are the signals in digital format of the incoming signals S_RXH1-S_RXHo respectively.

According to the present invention, the digital signals D_RXH1-D_RXHo generated by the receiving devices 106_1-106_o are based on the incoming signals S_RXH1-S_RXHo respectively. In other words, the receiving devices 106_1-106_o are arranged to one-to-one generate the digital signals D_RXH1-D_RXHo according to the incoming signals S_RXH1-S_RXHo respectively. Therefore, the receiving devices 106_1-106_o may be regarded as an all-digital receiver. During the receiving mode, the digital signals D_RXH1-D_RXHo are also processed by a range and doppler processing unit 1086a in the second beamform processing unit 1086 to generate a plurality of processed digital signals D_RXH_RP1-D_RXH_RPo respectively. According to the present embodiment, the range and doppler processing unit 1086a generates the plurality of processed digital signals D_RXH_RP1-D_RXH_RPo according to a range index R_bin and a velocity index V_bin. It is noted that, during the receiving mode, the range index R_bin and the velocity index V_bin in the second beamform processing unit 1086 may be the same as the range index R_bin and the velocity index V_bin in the first beamform processing unit 1084 respectively. For example, the range and doppler processing unit 1086a may be configured as a match filter to generate the plurality of processed digital signals D_RXH_RP1-D_RXH_RPo according to the range index R_bin and the velocity index V_bin. The operation of the range and doppler processing unit 1086a is similar to the operation of the range and doppler processing unit 1084a, thus the detailed description is omitted here for brevity.

Figure 19:
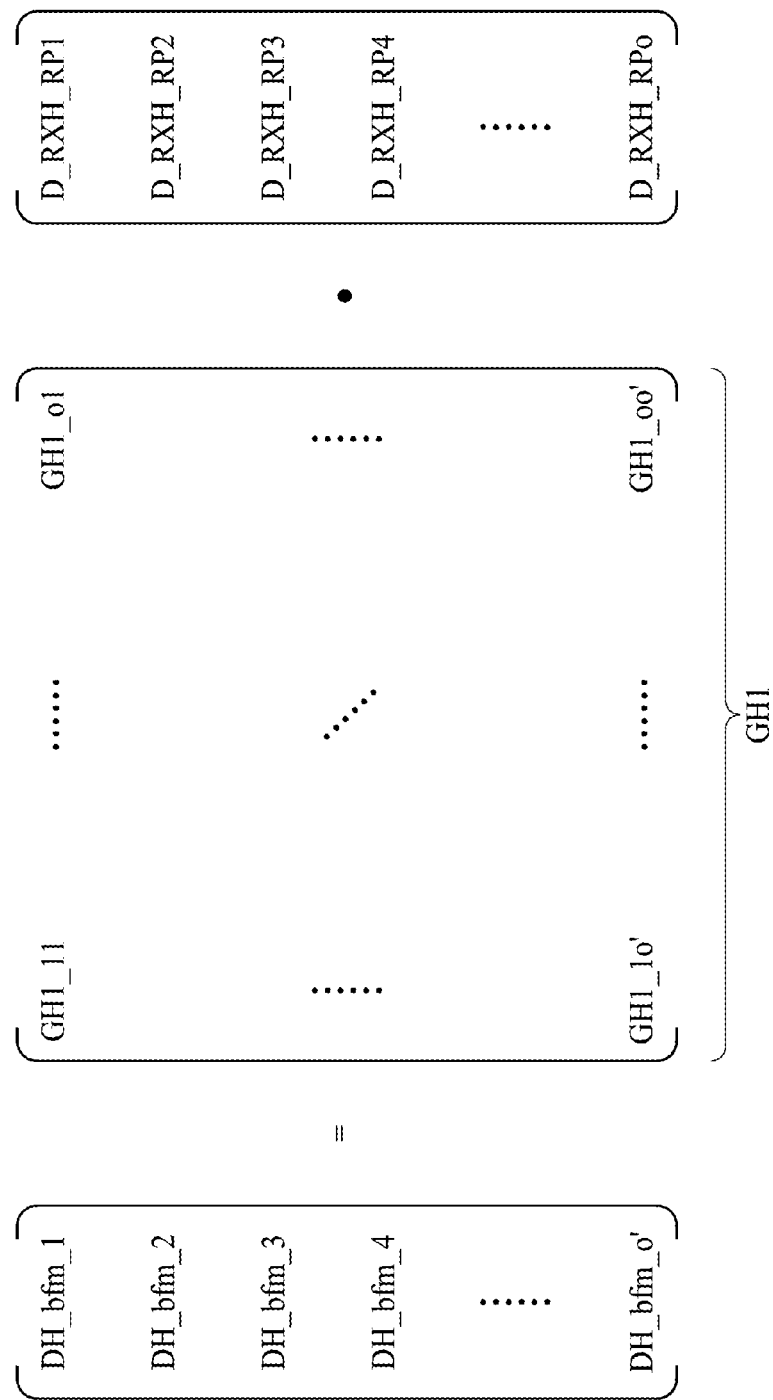
FIG. 19 is a diagram illustrating the generation of a plurality of second beamforming signals from a plurality of processed digital signals by using a gain matrix in accordance with some embodiments.

Then, the multibeam processing unit 1086b in the first beamform processing unit 1086 is arranged to perform a beamforming operation upon the plurality of processed digital signals D_RXH_RP1-D_RXH_RPo to generate the plurality of second beamforming signals DH_bfm_1-DH_bfm_o' according to a gain matrix GH1. The plurality of second beamforming signals DH_bfm_1-DH_bfm_o' correspond to a plurality of azimuth angles $\sin^{-1} \alpha_1$-$\sin^{-1} \alpha_o'$ respectively. FIG. 19 is a diagram illustrating the generation of the plurality of second beamforming signals DH_bfm_1-DH_bfm_o' from the plurality of processed digital signals D_RXH_RP1-D_RXH_RPo by using the gain matrix GH1 in accordance with some embodiments. FIG. 19 is a simplified illustration of the generation of the plurality of second beamforming signals DH_bfm_1-DH_bfm_o'. The generation of the plurality of second beamforming signals DH_bfm_1-DH_bfm_o' may be regarded as a dot product of the gain vector GH1 and the values of the plurality of processed digital signals D_RXH_RP1-D_RXH_RPo. The gain matrix GH1 is a rectangular array comprising a plurality of complex gains, i.e. $\{(GH1\_11, GH1\_21, \ldots, GH1\_o1), (GH1\_12, GH1\_22, \ldots, GH1\_o2), \ldots, (GH1\_1o', GH1\_2o', \ldots, GH1\_on')\}$. The complex gains in the gain matrix GH1 may be independently adjusted to provide weightings for the plurality of processed digital signals D_RXH_RP1-D_RXH_RPo. For example, the first set of complex gains $(GH1\_11, GH1\_21, \ldots, GH1\_o1)$ is used to weight the plurality of processed digital signals D_RXH_RP1-D_RXH_RPo respectively, such that the second beamforming signal DH_bfm_1 has a receiving main lobe directing at the first altitude angle $\sin^{-1} \alpha_1$. The second set of complex gains $(GH1\_12, GH1\_22, \ldots, GH1\_o2)$ is used to weight the plurality of processed digital signals D_RXH_RP1-D_RXH_RPo respectively, such that the second beamforming signal DH_bfm_2 has a receiving main lobe directing at the second altitude angle $\sin^{-1} \alpha_2$, and so on. According to the present invention, the gain matrix GH1 is determined by the second beamform processing unit 1086. However, this is not a limitation of the present invention. The gain matrix GH1 may be determined by a processing unit external to the first beamform processing unit 1086.

Figure 20:
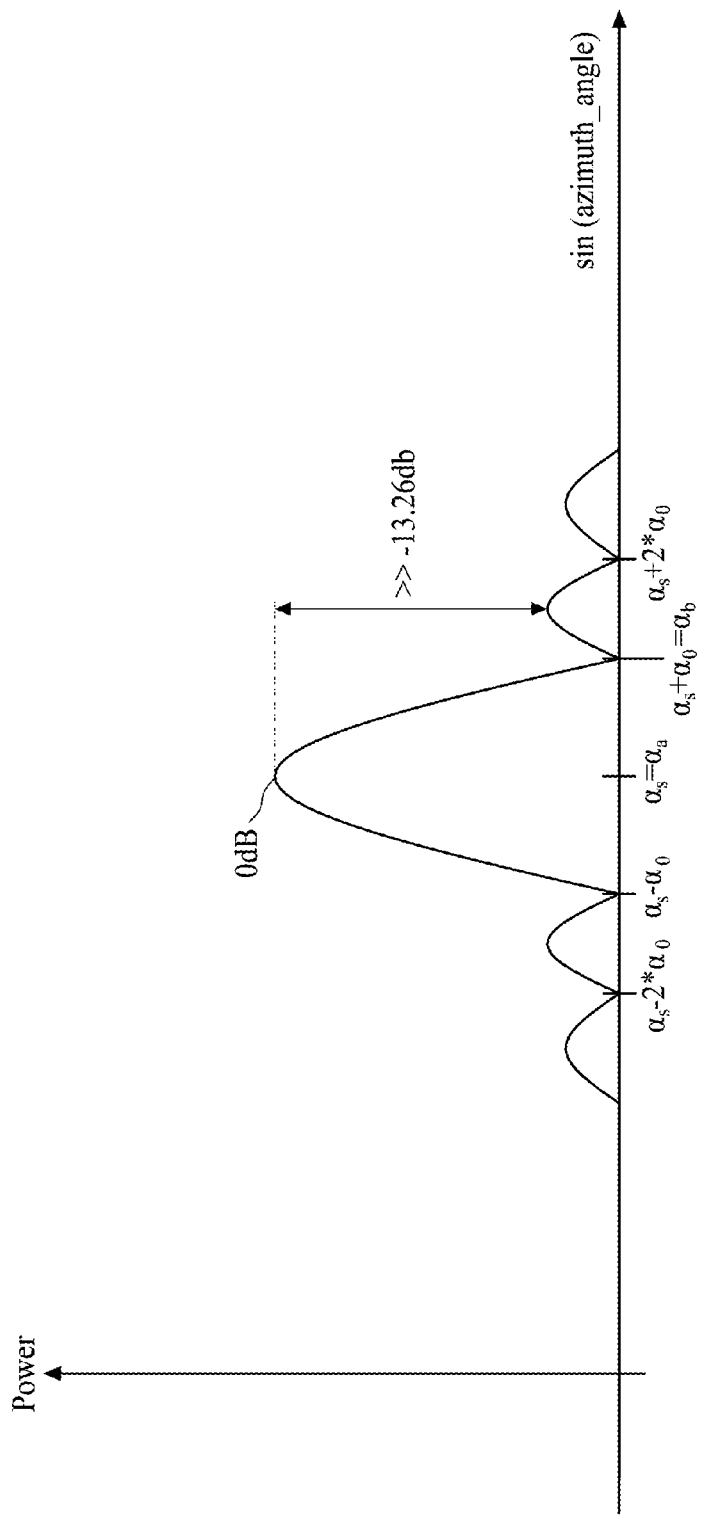
FIG. 20 is a diagram illustrating a response of an equivalent receiving radiation pattern of a plurality of receiving devices in angular domain in accordance with some embodiments.

More specifically, during the receiving mode, through the adjustment of the gain matrix GH1, the powers of the side lobes of the equivalent receiving radiation pattern of the receiving devices 106_1-106_o may be rejected. FIG. 20 is a diagram illustrating a response of the equivalent receiving radiation pattern of the receiving devices 106_1-106_o in angular domain in accordance with some embodiments. In this embodiment, the power of the equivalent receiving main lobe at the azimuth angle $\sin^{-1} \alpha_a$ is kept intact or slightly decreased (for example, the equivalent power of the equivalent receiving main lobe at the azimuth angle $\sin^{-1} \alpha_a$ is 0 dB), and the powers of the equivalent receiving side lobes (i.e. the side lobe between the azimuth angles $\sin^{-1}(\alpha_s+\alpha_0)$ (i.e. $\sin^{-1} \alpha_b$) and $\sin^{-1}(\alpha_s+2*\alpha_0)$, and the side lobe between the azimuth angles $\sin^{-1}(\alpha_s-2*\alpha_0)$ and $\sin^{-1}(\alpha_s-\alpha_0)$) are rejected or compressed to be much smaller than the power of the equivalent receiving main lobe at the azimuth angle $\sin^{-1} \alpha_a$. For example, the difference power between the power of the equivalent receiving main lobe at the azimuth angle $\sin^{-1} \alpha_a$ and the power of the equivalent receiving first side lobe (e.g. the side lobe between the azimuth angles $\sin^{-1}(\alpha_s+\alpha_0)$ (i.e. $\sin^{-1} \alpha_b$) and $\sin^{-1}(\alpha_s+2*\alpha_0)$) may be much greater than −13.26 dB. For another example, the difference power between the power of the equivalent receiving main lobe at the azimuth angle $\sin^{-1} \alpha_a$ and the power of the equivalent receiving first side lobe (e.g. the side lobe between the azimuth angles $\sin^{-1}(\alpha_s+\alpha_0)$ (i.e. $\sin^{-1} \alpha_b$) and $\sin^{-1}(\alpha_s+2*\alpha_0)$) is about −60 dB.

Moreover, during the receiving mode, when the power of the equivalent receiving side lobes is rejected through the adjustment of the gain matrix GH1, the beam width of the equivalent receiving main lobe may be increased, and the azimuth angles of the equivalent receiving side lobes may be shifted. Therefore, the gain matrix GH1 may be adjusted to make the azimuth angles $\sin^{-1}(\alpha_s-2*\alpha_0)$, $\sin^{-1}(\alpha_s-\alpha_0)$, $\sin^{-1}(\alpha_s+\alpha_0)$ (i.e. $\sin^{-1}\alpha_b$), and $\sin^{-1}(\alpha_s+2*\alpha_0)$ to locate at or near to the nulls of the equivalent receiving radiation pattern of the receiving devices 106_1-106_o as shown in FIG. 20. According to some embodiments, the locations of nulls may be located at or around the azimuth angles $\sin^{-1}(\alpha_s+$ (k/2)*$\alpha_0$), where k may be integer number except for zero (e.g. −4, −3, −2, −1, +1, +2, +3, +4). The nulls may be the zero power locations of the equivalent receiving radiation pattern of the receiving devices 106_1-106_o. When the azimuth angles $\sin^{-1}(\alpha_s-2*\alpha_0)$, $\sin^{-1}(\alpha_s-\alpha_0)$, $\sin^{-1}(\alpha_s+\alpha_0)$ (i.e. $\sin^{-1}\alpha_b$), and $\sin^{-1}(\alpha_s+2*\alpha_0)$ are located at or around the nulls of the equivalent receiving radiation pattern of the receiving devices 106_1-106_o, the powers of receiving signals of the receiving devices 106_1-106_o at the azimuth angles $\sin^{-1}(\alpha_s-2*\alpha_0)$, $\sin^{-1}(\alpha_s-\alpha_0)$, $\sin^{-1}(\alpha_s+\alpha_0)$ (i.e. $\sin^{-1}\alpha_b$), and $\sin^{-1}(\alpha_s+2*\alpha_0)$ may also be rejected to or about zero as shown in FIG. 21.

Figure 21:
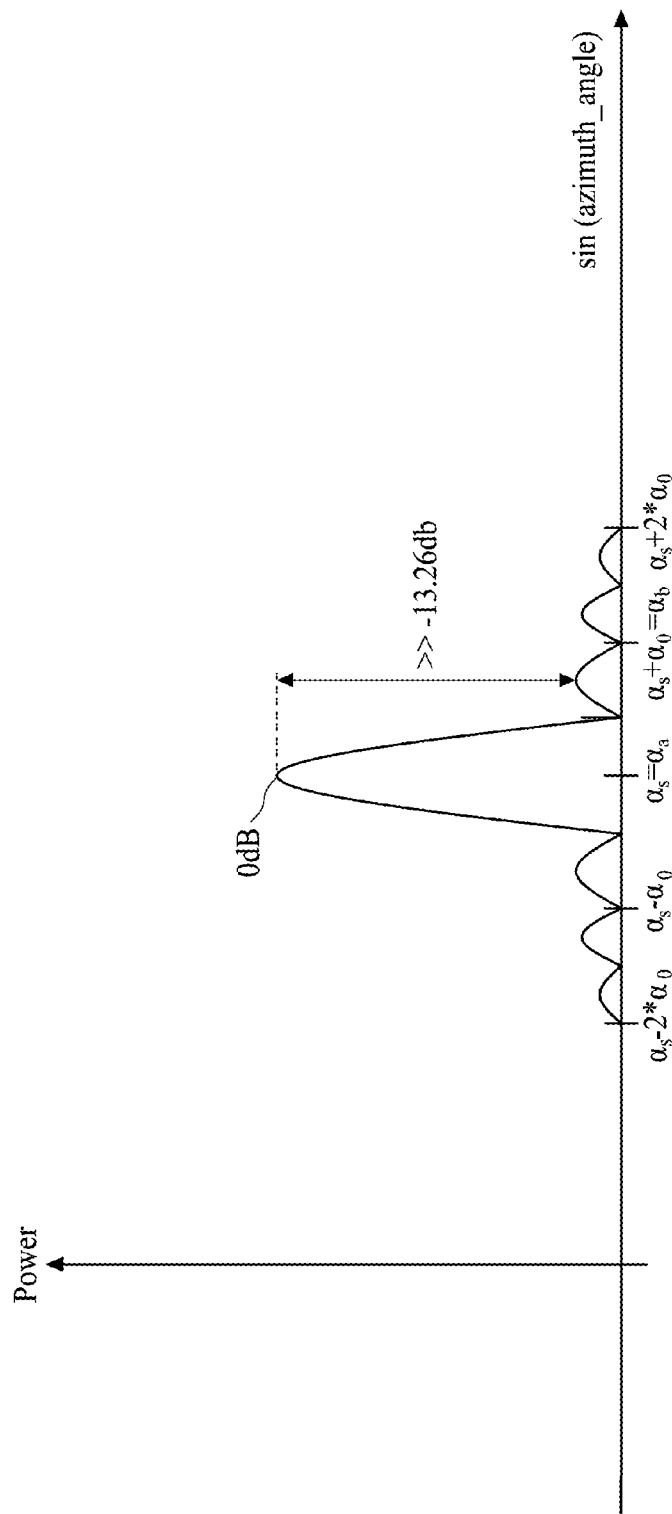
FIG. 21 is a diagram illustrating a response of an equivalent receiving radiation pattern of a plurality of receiving devices in combination with a plurality of transmitting devices in angular domain in accordance with another embodiment.

FIG. 21 is a diagram illustrating a response of the equivalent radiation pattern of the receiving devices 106_1-106_o in combination with the transmitting devices 102_1-102_m in angular domain in accordance with another embodiment. More specifically, FIG. 21 shows a response of the equivalent radiation pattern of the radiation pattern of the RF beam in FIG. 5 and the equivalent receiving radiation pattern of the receiving devices 106_1-106_o in FIG. 20. In other word, the response in FIG. 21 is the equivalent radiation pattern of the radar system 100 when the main lobe of the RF beam is directed to the azimuth angle $\sin^{-1}\alpha_a$. It can be seen that, in FIG. 21, the power of the equivalent main lobe at the azimuth angle $\sin^{-1}\alpha_a$ is kept intact or slightly decreased, the powers of the equivalent side lobes are rejected or compressed to be much smaller than the power of the equivalent main lobe at the azimuth angle $\sin^{-1}\alpha_a$, and the azimuth angles $\sin^{-1}(\alpha_s-2*\alpha_0)$, $\sin^{-1}(\alpha_s-\alpha_0)$, $\sin^{-1}(\alpha_s+\alpha_0)$ (i.e. $\sin^{-1}\alpha_b$), and $\sin^{-1}(\alpha_s+2*\alpha 0)$ are located at or around the nulls of the equivalent radiation pattern. Therefore, under the scenario as shown in FIG. 12, through the adjustment of the gain matrix GH1, the emitted power directed to the object 1102 at the azimuth angle $\sin^{-1}\alpha_a$ is still the high power of the main lobe while the emitted power directed to the object 1104 at the azimuth angle $\sin^{-1}\alpha_b$ is reduced to zero or closed to zero. In other words, under the scenario as shown in FIG. 12, through the adjustment of the gain matrix GH1, the received power at the azimuth angle $\sin^{-1}\alpha_a$ is dominated by the power reflected from the object 1102, and the side lobe effect caused by the object 1104 may be eliminated even though the size of the object 1104 is much greater than the size of the object 1102.

Figure 22:
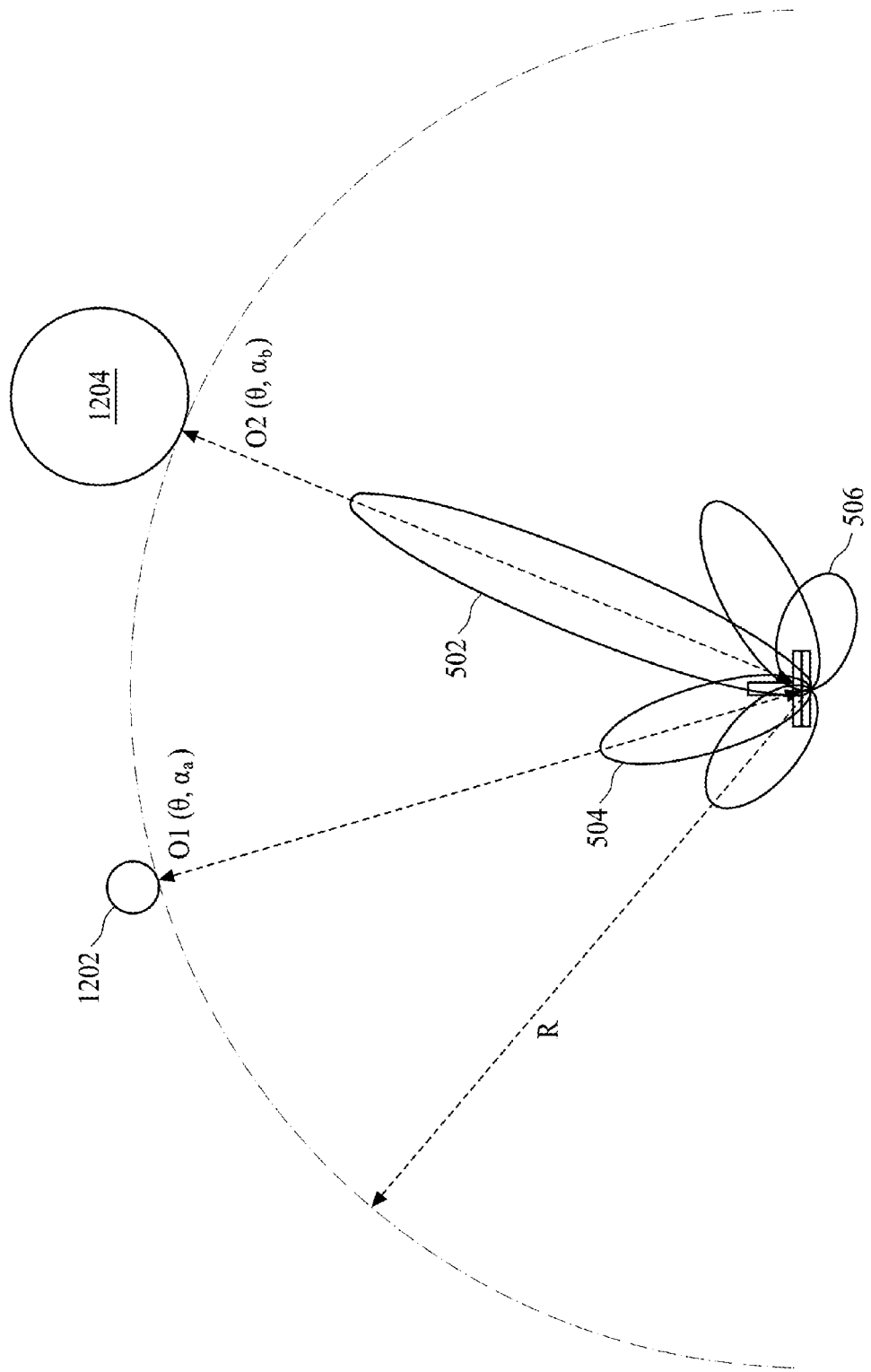
FIG. 22 is a diagram illustrating an RF beam of a radar system during the detection of a second object in accordance with some embodiments.

Then, when the azimuth angle of the main lobe 502 of the RF beam is changed to $\sin^{-1}\alpha_b$, the main lobe 502 and the side lobe 504 of the RF beam may hit the second object 1104 and the first object 1102 at the same time respectively as shown in FIG. 22, which is a diagram illustrating the RF beam of the radar system 100 during the detection of the second object 1104 in accordance with some embodiments. Similar to the operation as described in FIG. 15, during the receiving mode, the multibeam processing unit 1084b in the first beamform processing unit 1084 is arranged to perform a beamforming operation upon the plurality of processed digital signals D_RXV_RP1-D_RXV_RPn to generate the plurality of first beamforming signals DV_bfm_1-DV_bfm_n' according to the gain matrix GV. In this embodiment, the gain matrix GV corresponding to the azimuth angle $\sin^{-1}\alpha_b$ is similar to the gain matrix GV as shown in FIG. 15. The generation of the plurality of first beamforming signals DV_bfm_1-DV_bfm_n' and the detection of the altitude angle $\sin^{-1}\theta 3$ (i.e. the altitude angle $\sin^{-1}\theta$ of the objects 1102 and 1104) are similar to operation as described in above paragraphs related to FIG. 15, FIG. 16, and FIG. 17, thus the detailed description is omitted here for brevity.

Figure 23:
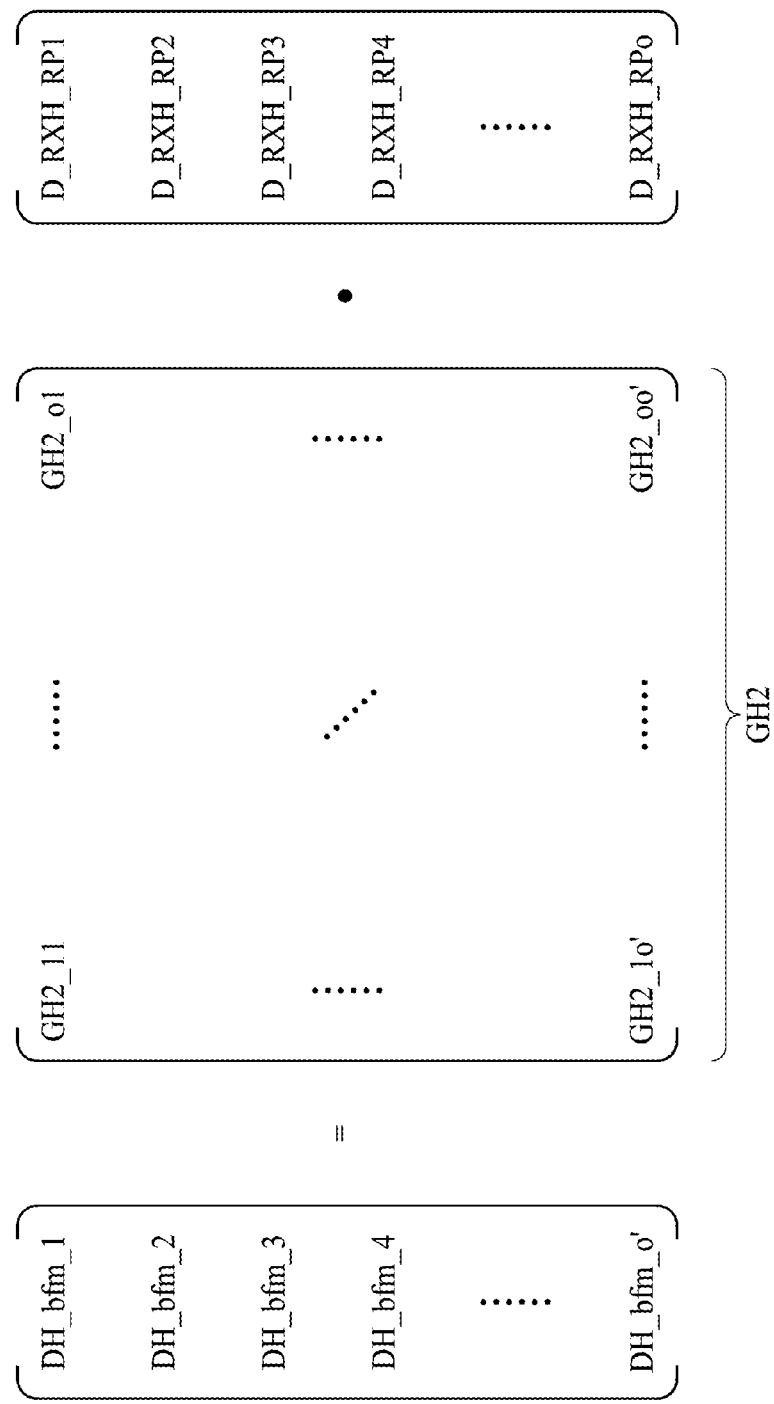
FIG. 23 is a diagram illustrating the generation of a plurality of second beamforming signals from a plurality of processed digital signals by using a gain matrix in accordance with some embodiments.

Meanwhile, under the scenario of FIG. 22, the multibeam processing unit 1086b in the first beamform processing unit 1086 is also arranged to perform a beamforming operation upon the plurality of processed digital signals D_RXH_RP1-D_RXH_RPo to generate the plurality of second beamforming signals DH_bfm_1-DH_bfm_o' according to another gain matrix GH2, which is different from the gain matrix GH1. The plurality of second beamforming signals DH_bfm_1-DH_bfm_o' correspond to a plurality of azimuth angles $\sin^{-1}\alpha_1$-$\sin^{-1}\alpha_o'$ respectively. FIG. 23 is a diagram illustrating the generation of the plurality of second beamforming signals DH_bfm_1-DH_bfm_o' from the plurality of processed digital signals D_RXH_RP1-D_RXH_RPo by using the gain matrix GH2 in accordance with some embodiments. FIG. 23 is a simplified illustration of the generation of the plurality of second beamforming signals DH_bfm_1-DH_bfm_o'. The generation of the plurality of second beamforming signals DH_bfm_1-DH_bfm_o' may be regarded as a dot product of the gain vector GH2 and the values of the plurality of processed digital signals D_RXH_RP1-D_RXH_RPo. The gain matrix GH2 is a rectangular array comprising a plurality of complex gains, i.e. {(GH2_11, GH2_21, ..., GH2_o1), (GH2_12, GH2_22, ..., GH2_o2), ..., (GH2_1o', GH2_2o', ..., GH2_on')}. The complex gains in the gain matrix GH2 may be independently adjusted to provide weightings for the plurality of processed digital signals D_RXH_RP1-D_RXH_RPo. The operation is similar to the operation as described in above paragraphs related to FIG. 19, thus the detailed description is omitted here for brevity.

Figure 24:
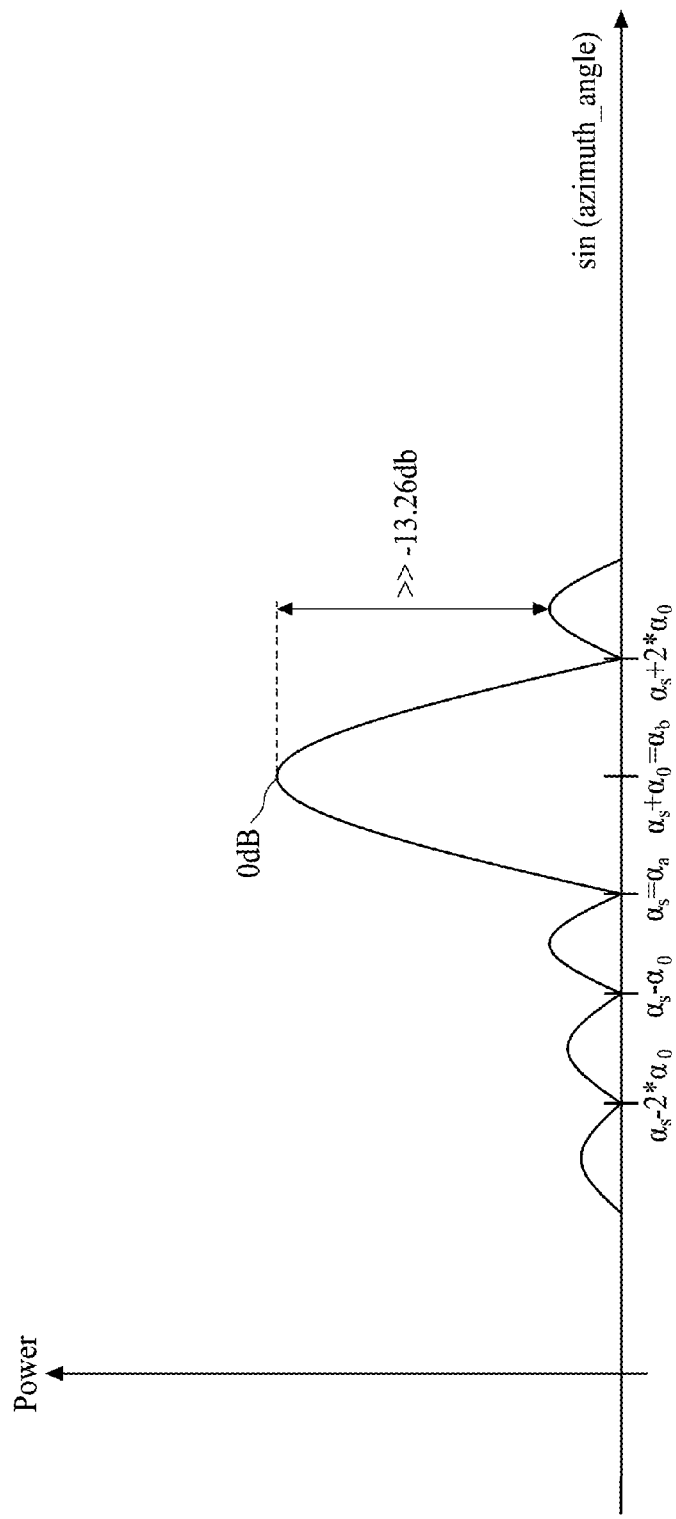
FIG. 24 is a diagram illustrating a response of the equivalent receiving radiation pattern of a plurality of receiving devices in angular domain in accordance with some embodiments.

Then, through the adjustment of the gain matrix GH2, the powers of the side lobes of the equivalent receiving radiation pattern of the receiving devices 106_1-106_o may be rejected. FIG. 24 is a diagram illustrating a response of the equivalent receiving radiation pattern of the receiving devices 106_1-106_o in angular domain in accordance with some embodiments. In this embodiment, the power of the equivalent receiving main lobe at the azimuth angle $\sin^{-1}\alpha_b$ is kept intact or slightly decreased (for example, the equivalent power of the equivalent receiving main lobe at the azimuth angle $\sin^{-1}\alpha_b$ is 0 dB), and the powers of the equivalent receiving side lobes (i.e. the side lobe between the azimuth angles $\sin^{-1}(\alpha_s)$ (i.e. $\sin^{-1}\alpha_a$) and $\sin^{-1}(\alpha_s-\alpha_0)$) are rejected or compressed to be much smaller than the power of the equivalent receiving main lobe at the azimuth angle $\sin^{-1}\alpha_b$. For example, the difference power between the power of the equivalent receiving main lobe at the azimuth angle $\sin^{-1}\alpha_b$ and the power of the equivalent receiving first side lobe (e.g. the side lobe between the azimuth angles $\sin^{-1}(\alpha_s)$ (i.e. $\sin^{-1}\alpha_a$) and $\sin^{-1}(\alpha_s-\alpha_0)$) may be much greater than −13.26 dB, e.g. about −60 dB.

Similarly, when the power of the equivalent receiving side lobes is rejected through the adjustment of the gain matrix GH2, the beam width of the equivalent receiving main lobe may be increased, and the azimuth angles of the equivalent receiving side lobes may be shifted. Therefore, the gain matrix GH2 may be adjusted to make the azimuth angles $\sin^{-1}(\alpha_s-2*\alpha_0)$, $\sin^{-1}(\alpha_s-\alpha_0)$, $\sin^{-1}\alpha_s$ (i.e. $\sin^{-1}\alpha_a$), and $\sin^{-1}(\alpha_s+2*\alpha_0)$ to locate at or near to the nulls of the equivalent receiving radiation pattern of the receiving devices 106_1-106_o as shown in FIG. 24. The equivalent effect is similar to the effect as described in above paragraphs related to FIGS. 20 and 21, thus the detailed description is omitted here for brevity.

Therefore, under the scenario as shown in FIG. 22, through the adjustment of the gain matrix GH2, the emitted power directed to the object 1104 at the azimuth angle $\sin^{-1} \alpha_b$ is still the high power of the main lobe while the emitted power directed to the object 1102 at the azimuth angle $\sin^{-1} \alpha_a$ is reduced to zero or closed to zero. Accordingly, under the scenario as shown in FIG. 22, when the size of the object 1104 is much greater than the size of the object 1102, the received power at the azimuth angle $\sin^{-1} \alpha_b$ is dominated by the power reflected from the object 1104, and the side lobe effect caused by the object 1102 may be eliminated.

Figure 25:
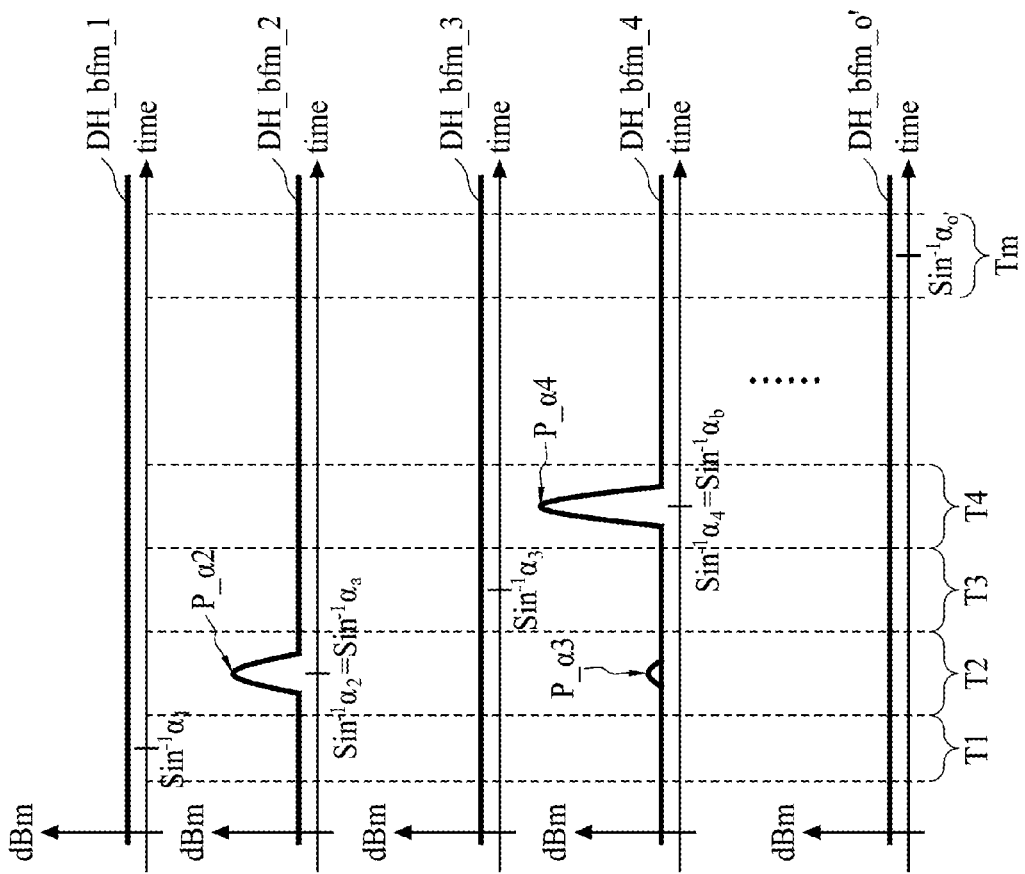
FIG. 25 is a diagram illustrating the powers of a plurality of second beamforming signals when a radar system scans from a first azimuth angle to a second azimuth angle in accordance with some embodiments.

FIG. 25 is a diagram illustrating the powers of the plurality of second beamforming signals DH_bfm_1-DH_bfm_o' when the radar system 100 scans from the azimuth angle $\sin^{-1} \alpha_1$ to the azimuth angle $\sin^{-1}$ am in accordance with some embodiments. The time domain of FIG. 25 is similar to the time domain of FIG. 10. More specifically, in the time slot T1, the transmitting main lobe of the RF signals S_TX1-S_TXm directs at the azimuth angle $\sin^{-1} \alpha_1$; in the time slot T2, the transmitting main lobe of the RF signals S_TX1-S_TXm directs at the azimuth angle $\sin^{-1} \alpha_2$; and so on. Under the scenario as shown in FIG. 11, the second beamforming signals DH_bfm_2 and DH_bfm_4 may have a power P_$\alpha$2 and a power P_$\alpha$3 in the time slot T2 respectively, in which the power P_$\alpha$2 is dominated by the power reflected from the object 1102, and the power P_$\alpha$3 may be omitted. Then, in the time slot T4, the second beamforming signal DH_bfm_4 may have a power P_$\alpha$4, in which the power P_$\alpha$4 is dominated by the power reflected from the object 1104, and the power reflected from the object 1102 is omitted. As the power of a beamforming signal is proportional to the RCS of an object, the analyzing unit 1088 may determine the RCS of the object 1102 and the object 1104 according to the power P_$\alpha$2 and the power P_$\alpha$4 respectively. In this embodiment, the power P_$\alpha$4 is much greater than the power P_$\alpha$2 as the size of the object 1104 is much greater than the size of the object 1102.

Figure 26:
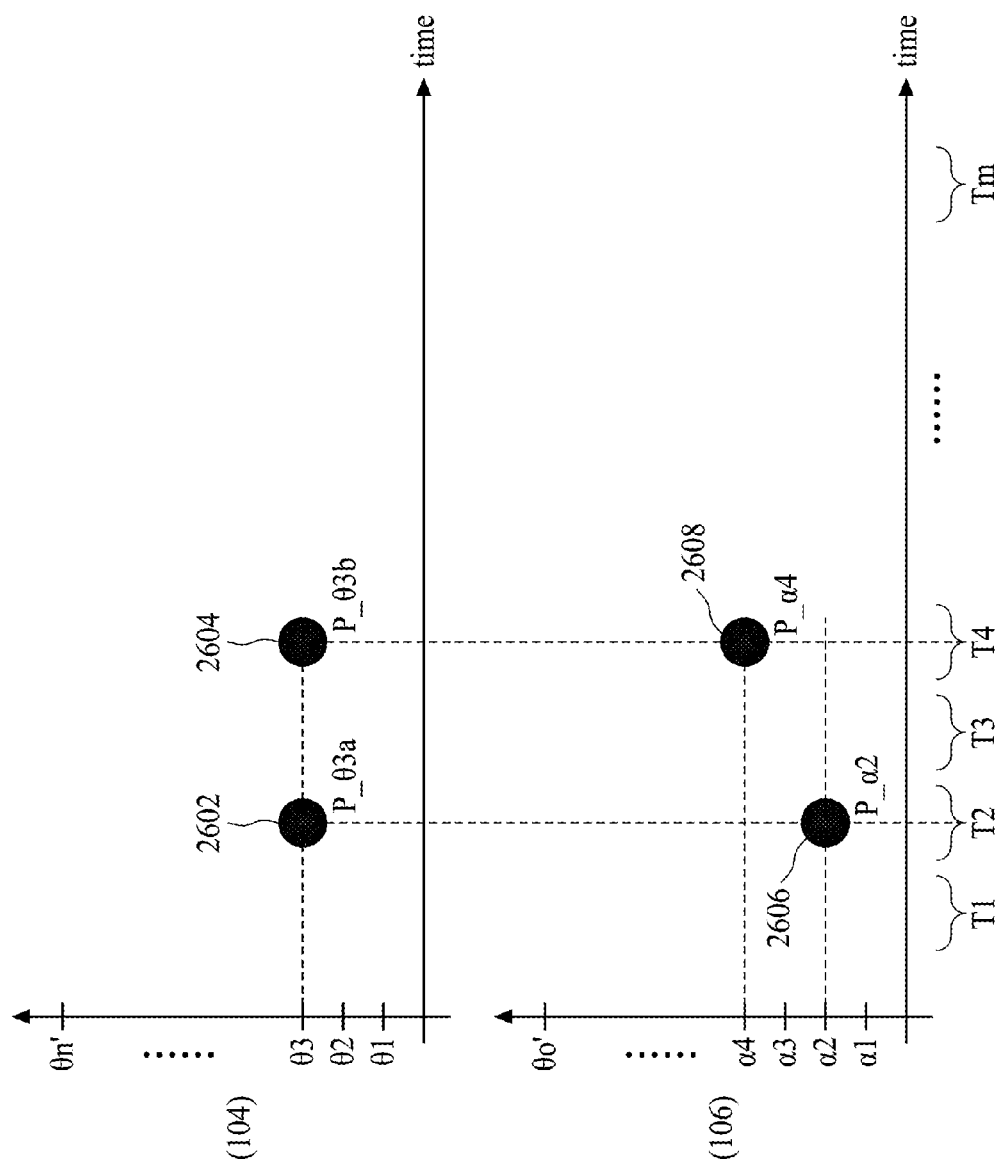
FIG. 26 is a diagram illustrating the analyzed output of an analyzing unit in accordance with some embodiments.

FIG. 26 is a diagram illustrating the analyzed output of the analyzing unit 1088 when the radar system 100 scans from the azimuth angle $\sin^{-1} \alpha_1$ to the azimuth angle $\sin^{-1} \alpha_m$ in accordance with some embodiments. The time domain of FIG. 26 is similar to the time domain of FIG. 10. More specifically, in the time slot T1, the transmitting main lobe of the RF signals S_TX1-S_TXm directs at the azimuth angle $\sin^{-1} \alpha_1$; in the time slot T2, the transmitting main lobe of the RF signals S_TX1-S_TXm directs at the azimuth angle $\sin^{-1} \alpha_2$; and so on. The upper diagram of FIG. 26 shows the detection results of the plurality of first beamforming signals DV_bfm_1-DV_bfm_n' (i.e. the altitude angle) with respect to the time slots T1-Tm. The lower diagram of FIG. 26 shows the detection results of the plurality of second beamforming signals DH_bfm_1-DH_bfm_o' (i.e. the azimuth angle) with respect to the time slots T1-Tm. In this embodiment, a first dot 2602 corresponding to the power P_$\theta$3 and a second dot 2064 corresponding to the power P_$\theta$3 are shown in the intersections of the time slots T2, T4 and the altitude angle $\sin^{-1} \theta$3. A third dot 2606 corresponding to the power P_$\alpha$2 and a fourth dot 2608 corresponding to the power P_$\alpha$4 are shown in the intersections of the time slots T2, T4 and the azimuth angles $\sin^{-1} \alpha_2$ and $\sin^{-1} \alpha_4$ respectively. In other words, when the radar system 100 scans from the azimuth angle $\sin^{-1} \alpha_1$ to the azimuth angle $\sin^{-1} \alpha_m$, the RCS and the coordinates of the objects 1102 and 1104 may be determined, wherein the objects 1102 and 1104 have the same range and radial speed with respect to the radar system 100.

Figure 27:
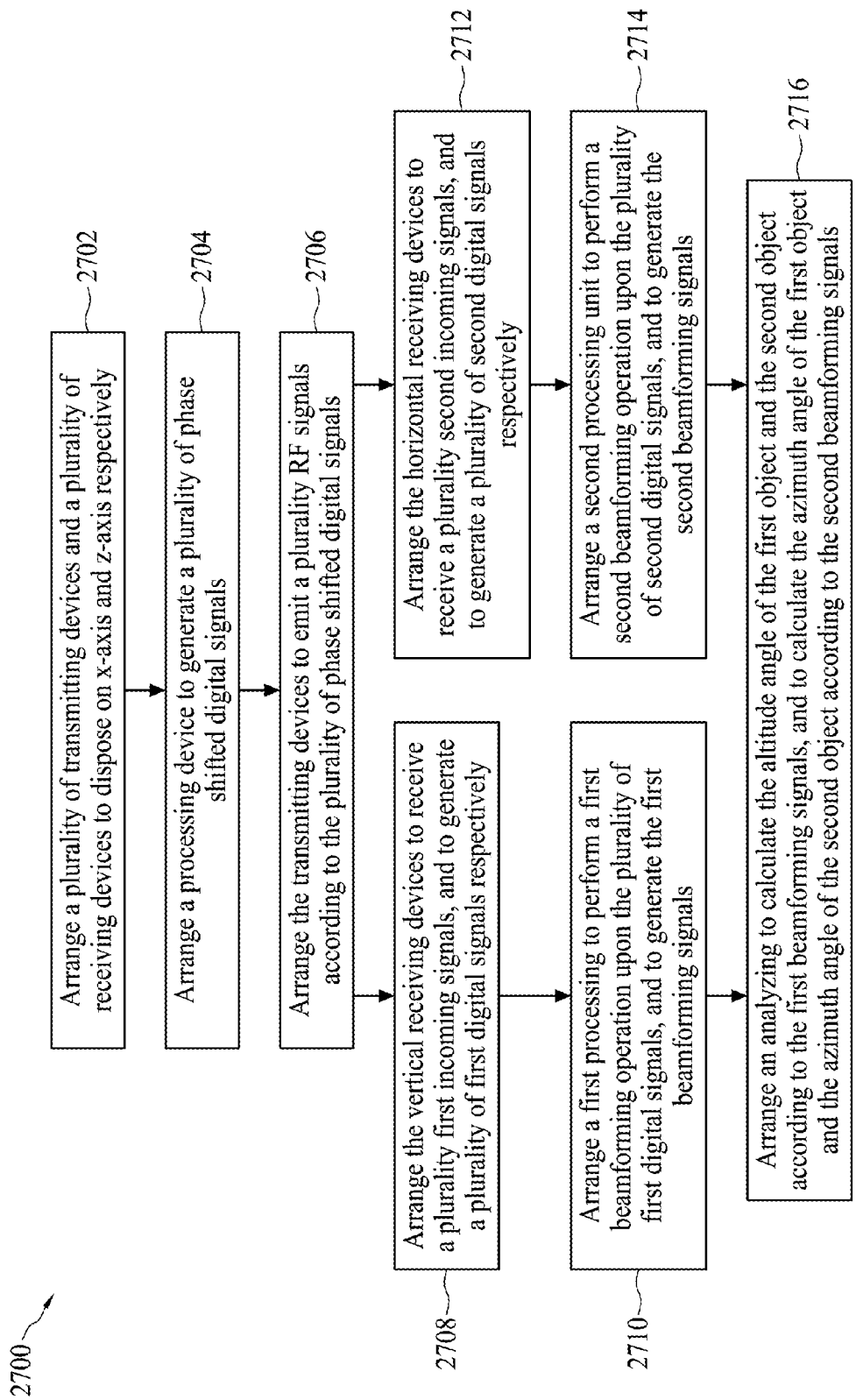
FIG. 27 is a flowchart illustrating a method of scanning remote objects in accordance with some embodiments.

FIG. 27 is a flowchart illustrating a method 2700 of scanning remote objects in accordance with some embodiments. For example, the above mentioned radar system 100 may applied the method 2700 to detect the coordinates and the sizes of the remote objects. For brevity, the detailed description of the method 2700 is described with the radar system 100, however this is not a limitation of the present invention. According to some embodiments, the method 2700 comprises operations 2702-2714. Provided that substantially the same result is achieved, the operations of the flowchart shown in FIG. 27 may not follow the same order and may not be contiguous. In some embodiments, other intermediate operations may be included.

In operation 2702, the transmitting devices 102_1-102_m are arranged to dispose on the y-axis. The distance between each two adjacent transmitting devices (e.g. 102_1 and 102_2) are predetermined, e.g. the distance is one half of the wavelength of the RF signals S_TX1-S_TXm. The receiving devices 104_1-104_n are arranged to dispose on the z-axis. The receiving devices 106_1-106_o are arranged to dispose on the y-axis. The distance between each two adjacent receiving devices (e.g. 104_1 and 104_2) are predetermined, e.g. the distance is one half of the wavelength of the RF signals S_TX1-S_TXm.

In operation 2704, the processing device 108 is arranged to generate the phase shifting digital signals D_TX1-D_TXm to the transmitting devices 102_1-102_m respectively.

In operation 2706, during the transmitting mode, the transmitting devices 102_1-102_m are arranged to generate the RF signals S_TX1-S_TXm according to the phase shifting digital signals D_TX1-D_TXm respectively. The RF signals S_TX1-S_TXm may form the RF beam having the main lobe 502 and the side lobes 504 and 506.

In operation 2708, during the receiving mode, the receiving devices 104_1-104_n are arranged to receive the first incoming signals S_RXV1-S_RXVn for generating the first digital signals D_RXV1-D_RXVn respectively.

In operation 2710, the first beamform processing unit 1084 is arranged to perform the first beamforming operation upon first digital signals D_RXV1-D_RXVn to generate the plurality of first beamforming signals DV_bfm_1-DV_bfm_n'. More specifically, the first beamform processing unit 1084 is arranged to perform a range and doppler processing to generates the plurality of processed digital signals D_RXV_RP1-D_RXV_RPn according to a range index R_bin and a velocity index V_bin, and to perform a beamforming operation to generate the plurality of first beamforming signals DV_bfm_1-DV_bfm_n' according to the plurality of processed digital signals D_RXV_RP1-D_RXV_RPn and the gain matrix GV.

Meanwhile, in operation 2712, during the receiving mode, the receiving devices 106_1-106_o are arranged to receive the second incoming signals S_RXH1-S_RXHo for generating the second digital signals D_RXH1-D_RXHo respectively.

In operation 2714, the second beamform processing unit 1086 is arranged to perform the second beamforming operation upon the second digital signals D_RXH1-D_RXHo to generate the plurality of second beamforming signals DH_bfm_1-DH_bfm_o'. More specifically, the second beamform processing unit 1086 is arranged to perform a range and doppler processing to generates the plurality of processed digital signals D_RXH_RP1-D_RXH_RPo according to a range index R_bin and a velocity index V_bin, and to perform a beamforming operation to generate the plurality of second beamforming signals DH_bfm_1-DH_bfm_o' according to the plurality of processed digital signals D_RXH_RP1-D_RXH_RPo and the gain matrix GH1.

In operation 2716, the analyzing unit 1088 is arranged to calculate the altitude angle $\sin^{-1} \theta$ of the first object 1102 and the second object 1104 according to the first beamforming signals DV_bfm_1-DV_bfm_n', and to calculate the azimuth angle $\sin^{-1} \alpha_a$ of the first object 1102 and the azimuth angle $\sin^{-1} \alpha_b$ of the second object 1104 according to the second beamforming signals DH_bfm_1-DH_bfm_o'. According to some embodiments, the analyzing unit 1088 may distinguish the RCS of the first object 1102 and the second object 1104 according to the second beamforming signals DH_bfm_1-DH_bfm_o', and the detailed description is omitted here for brevity.

Briefly, according to the present invention, the radar system 100 is an all-digital AESA system with relatively less number of transmitting devices and receiving devices in comparison to the existing arts. Therefore, the cost of the radar system 100 is less than the existing arts. Moreover, the radar system 100 is capable of operating operate in relatively high PAE region such that the radar system 100 may detect a farther object(s) in comparison to the existing arts. In addition, the radar system 100 is capable of detecting multiple objects fall within a wide-angle area without mechanically rotating the radar system 100. More specifically, the radar system 100 is capable of detecting multiple objects have the same range and radial speed with respect to the radar system 100. Therefore, the function of the radar system 100 is better than the existing arts while the power consumption is much lower than the existing arts.

According to some embodiments, a radar system is provided. The radar system comprises a processing device, a plurality of transmitting devices, a plurality of first receiving devices, and a plurality of second receiving devices. The processing device is arranged to generate a plurality of phase shifting digital signals. The plurality of transmitting devices are coupled to the processing device for generating an RF beam according to the plurality of phase shifting digital signals during a first mode, wherein the plurality of transmitting devices are disposed on a first axis, and the RF beam at least has a main lobe and a side lobe. The plurality of first receiving devices are coupled to the processing device for generating a plurality of first digital signals according to a plurality of first incoming signals, respectively, during a second mode different from the first mode, wherein the plurality of first receiving devices are disposed on a second axis different from the first axis. The plurality of second receiving devices are coupled to the processing device for generating a plurality of second digital signals according to a plurality of second incoming signals, respectively, during the second mode, wherein the plurality of second receiving devices are disposed on the first axis. Based on the plurality of first digital signals and the plurality of second digital signals, the processing device is further arranged to distinguish a first object and a second object when the RF beam hits the first object and the second object, and the first object and the second object have a same radial speed and are located at a same range.

According to some embodiments, a method of scanning remoted is provided. The method comprises the steps of: arranging a plurality of transmitting devices to dispose on a first axis; arranging a plurality of first receiving devices to dispose on a second axis different from the first axis; arranging a plurality of second receiving devices to dispose on the first axis; arranging a processing device to generate a plurality of phase shifting digital signals; arranging the plurality of transmitting devices for generating an RF beam according to the plurality of phase shifting digital signals during a first mode, wherein the RF beam at least has a main lobe and a side lobe; arranging a plurality of first receiving devices for generating a plurality of first digital signals according to a plurality of first incoming signals, respectively, during a second mode different from the first mode; arranging a plurality of second receiving devices for generating a plurality of second digital signals according to a plurality of second incoming signals, respectively, during the second mode; and arranging the processing device to distinguish a first object and a second object when the RF beam hits the first object and the second object, and the first object and the second object having a same radial speed and located at a same range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A radar system, comprising:
   a processing device, arranged to generate a plurality of phase shifting digital signals;
   a plurality of transmitting devices, coupled to the processing device, for generating a radio frequency (RF) beam according to the plurality of phase shifting digital signals during a first mode, wherein the plurality of transmitting devices are disposed on a first axis;
   a plurality of first receiving devices, coupled to the processing device, for generating a plurality of first digital signals according to a plurality of first incoming signals, respectively, during a second mode different from the first mode, wherein the plurality of first receiving devices are disposed on a second axis different from the first axis; and
   a plurality of second receiving devices, coupled to the processing device, for generating a plurality of second digital signals according to a plurality of second incoming signals, respectively, during the second mode, wherein the plurality of second receiving devices are disposed on the first axis;
   wherein, based on the plurality of first digital signals and the plurality of second digital signals, the processing device is further arranged to distinguish a first object and a second object when the RF beam hits the first object and the second object, and the first object and the second object have a same radial speed and are located at a same range, and the processing device comprises:
   a first processing unit, coupled to the plurality of first receiving devices, for performing a first beamforming operation to generate a plurality of first beamforming signals according to the plurality of first digital signals and a first gain matrix; and
   a second processing unit, coupled to the plurality of second receiving devices, for performing a second beamforming operation to generate a plurality of second beamforming signals according to the plurality of second digital signals and a second gain matrix;
wherein the processing device is further arranged to determine an altitude angle of the first object and the second object according to the plurality of first beamforming signals, and to determine a first azimuth angle of the first object and a second azimuth angle of the second object according to the plurality of second beamforming signals.

2. The radar system of claim 1, wherein the first axis is parallel to a horizontal level, and the second axis is orthogonal to the first axis.

3. The radar system of claim 1, wherein the RF beam at least has a main lobe and a side lobe, one of the main lobe and the side lobe hits the first object, and the other of the main lobe and the side lobe hits the second object.

4. The radar system of claim 1, wherein the first processing unit is further arranged to perform a range and doppler processing upon the plurality of first digital signals to generate a plurality of processed digital signals, respectively, according to a range index and a velocity index, and the first processing unit performs the first beamforming operation upon the plurality of processed digital signals to generate the plurality of first beamforming signals according to the first gain matrix.

5. The radar system of claim 1, wherein the second processing unit is further arranged to perform a range and doppler processing upon the plurality of second digital signals to generate a plurality of processed digital signals, respectively, according to a range index and a velocity index, and the second processing unit performs the second beamforming operation upon the plurality of processed digital signals to generate the plurality of second beamforming signals according to the second gain matrix.

6. The radar system of claim 1, wherein the plurality of first beamforming signals comprises a plurality of first receiving main lobes directing at a plurality of altitude angles respectively, and the plurality of second beamforming signals comprises a plurality of second receiving main lobes directing at a plurality of azimuth angles respectively.

7. The radar system of claim 1, wherein the second processing unit is further arranged to determine the second gain matrix such that a power of a side lobe of an equivalent receiving radiation pattern of the plurality of second receiving devices is at least 13 dB smaller than a power of a main lobe of the equivalent receiving radiation pattern of the plurality of second receiving devices.

8. The radar system of claim 1, wherein the second processing unit is further arranged to determine the second gain matrix such that a null of an equivalent receiving radiation pattern of the plurality of second receiving devices is located around an azimuth angle of the side lobe of the RF beam.

9. The radar system of claim 1, wherein, for a specific azimuth angle, the plurality of transmitting devices are further arranged to generate a plurality of RF beams directing at the specific azimuth angle at a plurality of times respectively;
wherein a frequency of each RF beam of the plurality of RF beams gradually increases from a first frequency to a second frequency.

10. The radar system of claim 1, wherein the processing device further comprises:
an analyzing unit, coupled to the first processing unit and the second processing unit, for determining a radar cross-section (RCS) of the first object according to a signal power of a beamforming signal selected from the plurality of second beamforming signals;
wherein a receiving main lobe of the selected beamforming signal directs at the first azimuth angle of the first object.

11. The radar system of claim 1, wherein the processing device is further arranged to control the plurality of transmitting devices to sweep for a specific azimuth range by shifting a plurality of phases of the plurality of phase shifting digital signals respectively.

12. The radar system of claim 1, wherein the plurality of transmitting devices comprises a plurality of power amplifiers for generating a plurality of RF signals respectively, the plurality of RF signals form the RF beam, each of the plurality of power amplifiers is arranged to operate within a power added efficiency (PAE) region, and the PAE region includes the maximum PAE region of the power amplifier.

13. A method of scanning remote objects, comprising:
arranging a plurality of transmitting devices to dispose on a first axis;
arranging a plurality of first receiving devices to dispose on a second axis different from the first axis;
arranging a plurality of second receiving devices to dispose on the first axis;
arranging a processing device to generate a plurality of phase shifting digital signals;
arranging the plurality of transmitting devices for generating an RF beam according to the plurality of phase shifting digital signals during a first mode;
arranging a plurality of first receiving devices for generating a plurality of first digital signals according to a plurality of first incoming signals, respectively, during a second mode different from the first mode;
arranging a plurality of second receiving devices for generating a plurality of second digital signals according to a plurality of second incoming signals, respectively, during the second mode; and
arranging the processing device to distinguish a first object and a second object when the RF beam hits the first object and the second object, and the first object and the second object having a same radial speed and located at a same range;
wherein the step of arranging the processing device to distinguish the first object and the second object comprises:
performing a first beamforming operation to generate a plurality of first beamforming signals according to the plurality of first digital signals and a first gain matrix;
performing a second beamforming operation to generate a plurality of second beamforming signals according to the plurality of second digital signals and a second gain matrix; and
determining an altitude angle of the first object and the second object according to the plurality of first beamforming signals, and to determine a first azimuth angle of the first object and a second azimuth angle of the second object according to the plurality of second beamforming signals.

14. The method of claim 13, wherein the step of arranging the processing device to distinguish the first object and the second object further comprises:
performing a range and doppler processing upon the plurality of first digital signals to generate a plurality of processed digital signals, respectively, according to a range index and a velocity index; and performing the first beamforming operation upon the plurality of processed digital signals to generate the plurality of first beamforming signals according to the first gain matrix.

15. The method of claim 13, wherein the step of arranging the processing device to distinguish the first object and the second object further comprises:
performing a range and doppler processing upon the plurality of second digital signals to generate a plurality of processed digital signals, respectively, according to a range index and a velocity index; and
performing the second beamforming operation upon the plurality of processed digital signals to generate the plurality of second beamforming signals according to the second gain matrix.

16. The method of claim 13, wherein the step of performing the second beamforming operation further comprises:
determining the second gain matrix such that a power of a side lobe of an equivalent receiving radiation pattern of the plurality of second receiving devices is at least 13 dB smaller than a power of a main lobe of the equivalent receiving radiation pattern of the plurality of second receiving devices.

17. The method of claim 13, wherein the step of performing the second beamforming operation further comprises:
determining the second gain matrix such that a null of an equivalent receiving radiation pattern of the plurality of second receiving devices is located around an azimuth angle of the side lobe of the RF beam.

18. The method of claim 13, wherein the step of performing the second beamforming operation further comprises:
determining a radar cross-section (RCS) of the first object according to a signal power of a beamforming signal selected from the plurality of second beamforming signals;
wherein a receiving main lobe of the selected beamforming signal directs at the first azimuth angle of the first object.

19. The method of claim 13, further comprising:
for a specific azimuth angle, arranging the plurality of transmitting devices to generate a plurality of RF beams directing at the specific azimuth angle at a plurality of times respectively;
wherein a frequency of each RF beam of the plurality of RF beams gradually increases from a first frequency to a second frequency.

20. The method of claim 13, further comprising:
arranging a plurality of power amplifiers in the plurality of transmitting devices to generate a plurality of RF signals respectively for forming the RF beam; and
arranging each of the plurality of power amplifiers to operate within a power added efficiency (PAE) region, wherein the PAE region includes the maximum PAE region of the power amplifier.

* * * * *